US008469550B2

(12) United States Patent
Di Trapani et al.

(10) Patent No.: US 8,469,550 B2
(45) Date of Patent: Jun. 25, 2013

(54) OPTICAL SKY-SUN DIFFUSER

(75) Inventors: Paolo Di Trapani, Cavallasca (IT); Alessandro Averchi, Monza (IT); Marta Cecilia Pigazzini, Esino Lario (IT)

(73) Assignee: Light in Light S.R.L., Como (IT)

( * ) Notice: Subject to any disclaimer, the term of this patent is extended or adjusted under 35 U.S.C. 154(b) by 89 days.

(21) Appl. No.: 12/977,070

(22) Filed: Dec. 23, 2010

(65) Prior Publication Data

US 2011/0216542 A1   Sep. 8, 2011
US 2013/0070463 A2   Mar. 21, 2013

Related U.S. Application Data

(63) Continuation of application No. PCT/EP2009/057674, filed on Jun. 19, 2009.

(30) Foreign Application Priority Data

Jun. 24, 2008  (IT) .............................. MI2008A1135

(51) Int. Cl.
*F21V 5/00* (2006.01)
*F21V 5/02* (2006.01)
*G02B 5/22* (2006.01)

(52) U.S. Cl.
USPC ...................... 362/311.01; 362/339; 359/885

(58) Field of Classification Search
USPC .................................................. 362/311.01
See application file for complete search history.

(56) References Cited

U.S. PATENT DOCUMENTS

| | | | |
|---|---|---|---|
| 3,907,581 A | 9/1975 | Willcox | |
| 6,791,259 B1 | 9/2004 | Stokes et al. | |
| 7,259,400 B1 | 8/2007 | Taskar | |
| 2004/0233526 A1 | 11/2004 | Kaminsky et al. | |
| 2006/0091779 A1 | 5/2006 | Takeda et al. | |
| 2007/0043496 A1 | 2/2007 | Ogawa | |
| 2007/0231504 A1* | 10/2007 | Wu ................................ 428/1.3 |

(Continued)

FOREIGN PATENT DOCUMENTS

| EP | 0634445 | 1/1995 |
|---|---|---|
| EP | 1843400 | 10/2007 |

(Continued)

OTHER PUBLICATIONS

International Search Report based on International Application No. PCT/EP2009/057672, European Patent Office, Oct. 14, 2009, pp. 4.

(Continued)

*Primary Examiner* — Anh Mai
*Assistant Examiner* — Michael Santonocito
(74) *Attorney, Agent, or Firm* — Graybeal Jackson LLP

(57) ABSTRACT

An embodiment of a solid optical sky-sun diffuser, which comprises a transparent solid matrix embedding a dispersion of transparent nanoparticles having an average size d in the range 10 nm$\leq$d$\leq$240 nm; wherein: the ratio between the blue and red scattering optical densities $\gamma$=Log [T(450 nm)]/Log [T(630 nm)] of said diffuser falls in the range 5$\geq\gamma\geq$2.5, where T($\lambda$) is the Monochromatic Normalized Collinear Transmittance; in at least one propagation direction, said Monochromatic Normalized Collinear Transmittance is T(450 nm)$\geq$0.4; in at least one propagation direction said Monochromatic Normalized Collinear Transmittance is T(450 nm)$\leq$0.9, said propagation direction being the same or different from that at which said Monochromatic Normalized Collinear Transmittance is T(450 mm)$\geq$0.4.

17 Claims, 11 Drawing Sheets

U.S. PATENT DOCUMENTS

| | | | |
|---|---|---|---|
| 2007/0236939 A1* | 10/2007 | Ouderkirk et al. | 362/339 |
| 2008/0012032 A1 | 1/2008 | Bhandarkar et al. | |
| 2008/0262117 A1 | 10/2008 | Avakian et al. | |
| 2011/0194270 A1 | 8/2011 | Trapani et al. | |

FOREIGN PATENT DOCUMENTS

| | | |
|---|---|---|
| JP | 2006059723 | 3/2006 |
| WO | 02089175 | 11/2002 |
| WO | 2007043496 | 4/2007 |
| WO | 2007105739 | 9/2007 |
| WO | 2009156347 | 12/2009 |
| WO | 2009156348 | 12/2009 |

OTHER PUBLICATIONS

International Search Report based on International Application No. PCT/EP2009/057674, European Patent Office, Oct. 5, 2009, pp. 3.

H.C. van de Hulst. Light Scattering by small particles. Copyright 1957, 1981. pp. 1-470. Dover Publications Inc. New York.

Anthony Bucholtz. Rayleigh-scattering calculations for the terrestrial atmosphere. May 20, 1995. pp. 2765-2773. vol. 34, No. 15. Applied Optics.

Thomas C. Grenfell and Stephen G. Warren. Representation of a nonspherical ice particle by a collection of independent spheres for scattering and absorption of radiation. Journal of Geophysical Research. vol. 104, No. D24. Dec. 27, 1999. pp. 31,697-31,709.

Andrew Stockman and Lindsay T. Sharpe. The spectral sensitivities of the middle-and long-wavelength-sensitive cones derived from measurements in observers of known genotype. Vision Research, 2000 Elsevier Science Ltd. Jan. 5, 2000. pp. 1711-1737.

Martin Rivera-Toledo, Luis E. Garcia-Crispin, Antonio FLores-Tlacuahuac, and Leopoldo Vilchis-Ramirez. Dynamic Modeling and Experimental Validation of the MMA Cell-Cast Process for Plastic Sheet Production. 2000 American Chemical Society. Ind. Eng. Chem. Res. 2006. vol. 45. pp. 8539-8553.

Ormocer. Oct. 2010. http://ormocer.de/EN/index.jsp?pring=true. Downloaded Oct. 8, 2012.

Genoa Science Festival in 2003 and 2005 and in Vilnius Railway Station (Lithuania) in 2007 (www.diluceinluce.eu).

* cited by examiner

OPTICAL SKY-SUN DIFFUSER

PRIORITY CLAIM

The present application is a Continuation of International Patent Application Serial No. PCT/EP2009/057674, filed Jun. 19, 2009; which further claims the benefit of Italian Patent Application MI2008A001135, filed Jun. 24, 2008; all of the foregoing applications are incorporated herein by reference in their entireties.

RELATED APPLICATION DATA

This application is related to U.S. patent application Ser. No. 13/001,050, entitled ILLUMINATION DEVICE filed Apr. 27, 2011, and which is incorporated herein by reference in its entirety.

TECHNICAL FIELD

An embodiment relates to an optical sky-sun nanodiffuser. In the present description the term "sky-sun nanodiffuser" designates an optical diffuser that simulates the diffusion of the sun light operated by the sky in nature. Particularly, an embodiment relates to an optical nanodiffuser of the type comprising a transparent solid matrix in which a plurality of solid transparent nanoparticles are dispersed. In the present description the term "nanodiffuser" designates a solid optical element which comprises a transparent solid matrix embedding a dispersion of transparent nanoparticles, whose average size d is in the range 10 nm≦d≦240 nm. In the following of the description the term "nanodiffuser" or "diffuser" may be used interchangeably. In any case they designate a nanodiffuser as defined above.

BACKGROUND

Optical diffusers comprising solid nanoparticles dispersed in a transparent solid matrix are known in the art.

U.S. Pat. No. 6,791,259 B1, which is incorporated by reference describes a white light illumination system comprising an LED or laser diode, a light scatterer material and a phosphor or luminescent dye material. The scatterer material preferably comprises particles dispersed in a substrate. The particles that scatter light have a size between 50 and 500 nm, preferably a size between $\lambda/3$ and $\lambda/2$, where $\lambda$ is the wavelength of the emission peak of the radiation source. The nanoscatterer is integrated at the level of the active element of the source, that is, it is positioned either before the phosphor or in the phosphor, in order to scatter preferably the blue component produced by the LED or laser diode, otherwise with low divergence, and to uniform it with the yellow component scattered by the phosphor, instead produced with a wide angle of divergence. The fact that the two yellow and blue components are scattered from practically coincident scatterer centers is a necessary condition to remove the "halo" phenomenon, characterized by the presence of a dominant blue color in the direction of maximum emission, and of a dominant yellow color in the peripheral area of the light cone produced by the source, that is, to uniform color distribution of the radiation at different angles.

WO 02/089175, which is incorporated by reference, describes light sources based on UV-LED emitters with reduced dispersion of UV radiation. The light sources are LEDs which emit in the UV and which are combined with UV reflectors constituted by particles dispersed in a solid material transparent to visible light. A phosphorescent material is applied to the UV source to convert UV radiation into visible light. In a particular embodiment the phosphorescent material is applied to the surface of the UV LED and a layer of scatterer material is applied to the phosphorescent layer. The aim of this illumination device structure is to reduce the amount of UV radiation not converted into visible light and does not tackle the problem of reproducing a light similar to natural light produced by the sun and the sky.

US 2008/0262117 A1, which is incorporated by reference, describes a diffused light transmitter comprising a substantially transparent resin in which nanometric size amorphous silica particles are dispersed. In one example a material having a Haze of 71-85% and a Light Transmittance of 35-40% is reported.

None of the documents above discloses an optical sky-sun diffuser, namely a diffuser capable to carry out chromatic separation substantially with the same mechanism that gives rise to chromatic separation in nature, thereby creating the correct spectral distribution characteristic of skylight and sunlight.

SUMMARY

Accordingly, an embodiment is a new type of optical diffuser capable of "separating" different chromatic components of a source with broad spectral bandwidth according to the same mechanism that gives rise to chromatic separation in nature, creating the correct spectral distribution characteristic of skylight and sunlight.

More particularly, an embodiment is a new type of optical diffuser capable of reproducing—when illuminated by visible white light—the simultaneous presence of two different chromatic components: a diffused skylight, in which blue ("cold") is dominant, and a transmitted sunlight, with a low blue component ("warm").

The aforesaid and other objects and advantages may be achieved with an embodiment of a solid optical sky-sun diffuser which comprises a transparent solid matrix embedding a dispersion of transparent nanoparticles, characterized in that:

said nanoparticles have an average size d in the range 10 nm≦d≦240 nm, the ratio between the blue and red scattering optical densities) $\gamma$=Log [T(450 nm)]/Log [T(630 nm)] of said diffuser falls in the range $5 \geq \gamma \geq 2.5$, where $T(\lambda)$ is the Monochromatic Normalized Collinear Transmittance, in at least one propagation direction, said Monochromatic Normalized Collinear Transmittance is T(450 nm)≧0.4, in at least one propagation direction, said Monochromatic Normalized Collinear Transmittance is T(450 nm)≦0.9, said propagation direction being the same or different from that at which said Monochromatic Normalized Collinear Transmittance is T(450 nm)≧0.4.

The average particle size is defined in the following of the present description and the Monochromatic Normalized Collinear Transmittance, in the following simply called "Transmittance", is defined by means of the measurement method illustrated in the present description.

BRIEF DESCRIPTION OF THE DRAWINGS

The macroscopic optical properties of the sky-sun diffuser of one or more embodiments are discussed in the following.

The enclosed figures and drawings illustrate one or more embodiments.

DETAILED DESCRIPTION

Figure 1:
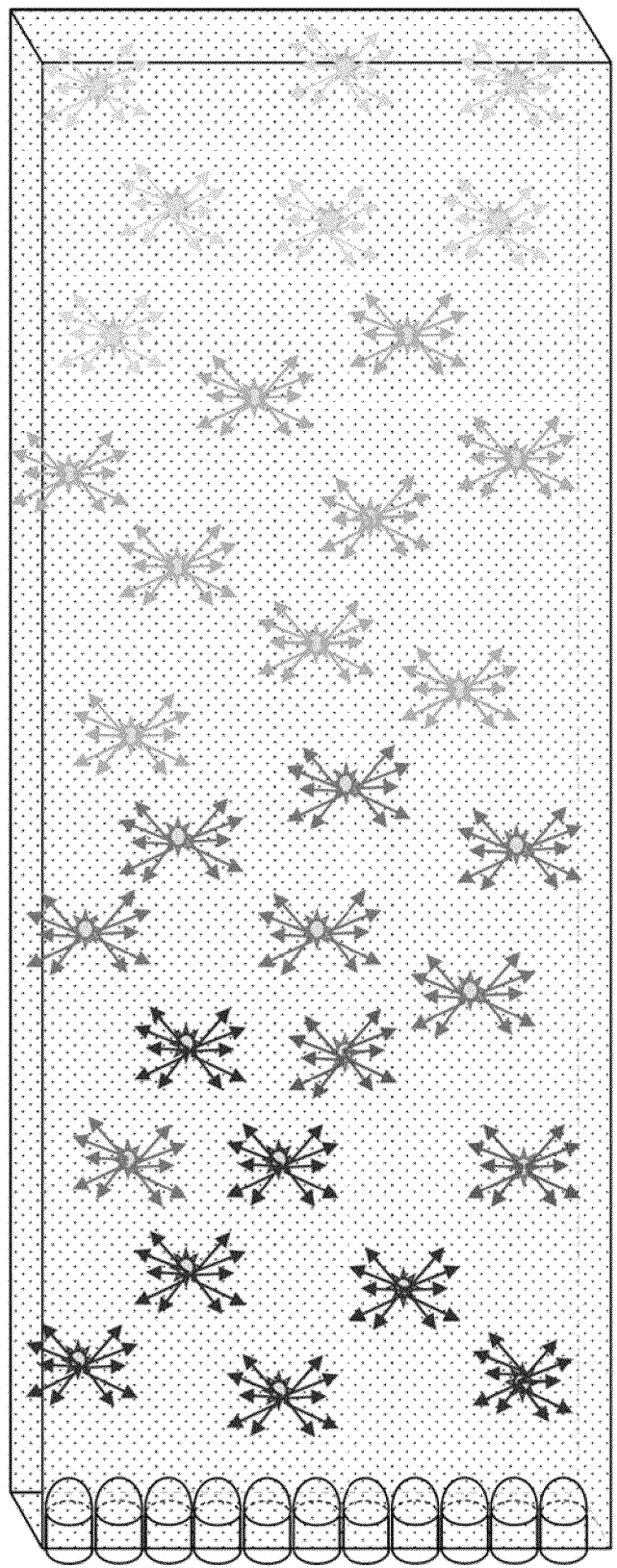
FIG. 1 shows a particular arrangement of the panel nanodiffuser where a light source, or an array of light sources, as for example an LED array, has been coupled to the diffuser from one side, to operate it as a sunset skylike diffuser, said sunset skylike diffuser being described at page 8 of the present description.

It is well known from fundamentals of light-scattering that a transparent optical element comprising transparent matrix and transparent nano-particles having different refraction index with respect to the matrix, and having average size significantly smaller than visible wavelength, will preferentially scatter the blue part of the spectrum, and transmit the red part. It is also known that the outlined chromatic separation improves for smaller sizes, the wavelength-dependence of the scattering efficiency per single particle approaching with good accuracy the $\lambda^{-4}$ Rayleigh limit law when the average particle size is $d \leq \lambda/10$. On increasing the particle size, in contrast, resonances and diffraction effects start to play a role, and become relevant typically for $d \geq \lambda/2$. These phenomena may cause a flattening of the wavelength-dependence in the scattered light. Moreover, they may cause an impinging white source to be separated in a plurality of different colors at different angles, which is of course a strongly undesired effect for the purpose of an embodiment. On the other hand, it is known that the scattering efficiency per single particle drops dramatically on decreasing particle size, being proportional to $d^{-6}$. This dependence makes the usage of too small particle inconvenient, as for example for the thickness of the diffuser which is used. In fact, achieving the necessary scattering efficiency by means of a diffuser based on small particles may require the light beam to see a high number of particles in the propagation direction. This condition may require medium-large thicknesses of the diffuser to be used, in order to prevent high volume-filling-fraction effects to take place, these filling-fraction effects being those described in the present description. For example, the request of not exceeding filling fractions of 0.1% sets to about 1 mm the minimum thickness of the diffuser for 50 nm $TiO_2$ nanoparticles in PMMA, the figure increasing substantially if smaller particles are used.

Therefore, for those applications for which the use of mm-cm thick diffusers does not represent a problem, small size particles, for example in the Rayleigh range $d \leq \lambda/10$ are recommended. In contrast, for those applications which benefit from the use of more compact diffusers a compromise between compactness and scattering quality may be considered, for which particle size $d > \lambda/10$ may be preferentially used. Moreover, the usage of small particles is also convenient for the purpose of minimizing the risk that aggregates composed of few particles spoil the quality of the scattering process. The scattering, in fact, is very sensitive even to a small fraction of these aggregates, due to the $d^{-6}$ dependence of scattering efficiency on particle size. Being the size of the aggregates proportional to that of the constituent particles, it is evident that in the case of larger particles there is an increase of the risk of producing resonances and diffraction effects, which may represent a problem for an embodiment. Therefore the usage of large particles may require a special care in the nano-diffuser material preparation, in order to ensure that aggregates do no play a relevant role.

For the purpose of an embodiment, the following condition is satisfied: 10 nm $\leq d \leq$ 240 nm, for example 20 nm $\leq d \leq$ 100 nm, such as 20 nm $\leq d \leq$ 50 nm, for those applications for which thick diffusers may be used. 10 nm $\leq d \leq$ 240 nm, for example 50 nm $\leq d \leq$ 180 nm, such as 70 nm $\leq d \leq$ 120 nm, for those applications for which compact devices are preferred. In both cases, d refers to the average size of the particles embedded in the diffuser. This condition does not forbid that in the diffuser are present also few particles with dimensions outside this range, but these particles should be in such a small quantity as to have negligible effects on the optical properties of the diffuser.

The choice of a correct average size range may be a necessary but by far not sufficient condition for ensuring the nanodiffuser to perform according to the scope of an embodiment, i.e. as the sky does with the light of the sun. First of all, depending on the chosen materials, conditions exist for which the undesired optical resonance and diffraction effects occur also for particle sizes $d \leq 240$ nm. Moreover, plenty of other effects, as for example those related to number of particles, to their concentration, to the geometrical shape of the diffuser, might dominate, which may prevent the desired chromatic separation to take place. To this end it is worth mentioning that other applications exist, or have been proposed, that comprise transparent nano-composites having particle sizes in ranges partially overlapped with the range here considered for which, however, chromatic separation and in some cases even visible scattering are not desired at all. For example, applications in LCD diffusers often use nanoparticles with size as large as 100 nm, as for example for the purpose of changing the average refraction index of a material, in the absence of any chromatic-separation effects [US2004/0233526, which is incorporated by reference]. On the other hand, thin-film UV filter applications, for which the absence of Haze in the visible is a fundamental request, are claimed with particles as large as 20 nm. [WO2007/043496 A1, which is incorporated by reference]

Surprisingly, in spite of the overall problem complexity, it has been found that a set of three, easily testable, conditions may guarantee a 10 nm$\leq$d$\leq$240 nm nanodiffuser to be adequate for the purposes of an embodiment. All these conditions concern macroscopic optical properties of the nanodiffuser at two specific wavelengths, which may be verified by measuring the nanodiffuser Transmittance, T($\lambda$), at these wavelengths.

A first optical property of a nanodiffuser of an embodiment is designated here as "sun-like" Transmittance. This is one of the optical properties that the nanodiffuser has in order to correctly simulate the diffusion of the sun light operated by the sky in nature, and specifically it refers to the capability of the diffuser to create a transmitted light having the colors characteristic of the light of the sun in the different hours of the day. In other terms, the diffuser of an embodiment modifies the spectrum of a white-light source that is transmitted through it in a given direction as the sky does with the light of the sun.

The light-scattering in the sky is well described by Rayleigh diffusion, $T_{sky}(\lambda) \approx \exp(-bL\lambda^{-4})$, where b is a constant which depends on the average scattering efficiency of the atmosphere, and L is the path length. This dependence explains why, on increasing the path length in the different hours of the day, the transmitted sun light becomes yellow and then red. For any pair of wavelengths of visible light, the sky therefore satisfies with good accuracy the Rayleigh limit, which states that the ratio between the sky optical densities at two wavelengths scales with the fourth power of the inverse of the ratio of the wavelengths, Log $[T_{sky}(\lambda_1)]$/Log $[T_{sky}(\lambda_2)] \approx (\lambda_1/\lambda_2)^{-4}$, where the relation does not depend on path length. Specifically, taking as a reference wavelengths $\lambda_1$=450 nm and $\lambda_2$=630 nm, and by defining the ratio between the optical densities at 450 nm and 630 nm, $\gamma \equiv$ Log [T(450 nm)]/Log [T(630 nm)] the measured air scattering in standard conditions at 15° C. [A. Bucholtz "Rayleigh-scattering calculations for the terrestrial atmosphere" Applied Optics, Vol 34 p. 2765 (1995), which is incorporated by reference] gives $\gamma_{sky}$=3.9606, while $(\lambda_1/\lambda_2)^{-4}$=3.8416.

In principle, conditioning the nanodiffuser Transmittance T($\lambda$) to fulfill Rayleigh scattering for the entire visible spectrum allows achieving the desired "sun-like" Transmittance. Surprisingly, it has been found that a nanodiffuser fulfilling the following much more simple condition:

"5$\geq\gamma\geq$2.5, for example 5$\geq\gamma\geq$3, such as 5$\geq\gamma\geq$3.5", which depends only on the nanodiffuser T(450 nm) and T(630 nm), suffices to potentially guarantee that when the nanodiffuser is illuminated by a broad-band white source, the transmitted light is perceived with the same color as that of the sun light which has crossed the sky, with the whole variety of tinges made achievable when diffusers having different optical thicknesses are used, according to the scope of an embodiment.

A second optical property of a nanodiffuser of an embodiment is designated here as "noon skylike diffusion". This is a further optical property that the nanodiffuser has in order to correctly simulate the diffusion of the sun light operated by the sky in nature, and specifically it refers to the capability of the diffuser to scatter the impinging white light by producing a diffused light having the same color as the light diffused by the sky, when the sun is close to the Zenith, i.e. at noon or during late morning or early-afternoon time. To this purpose it is worth noting that the condition $\gamma\geq$2.5 determines the quality of the transmitted light but not of the scattered light. In fact, it imposes no limitations on the amount of multiple scattering, which might severely impact the spectral features of the scattered light. Indeed, for strong multiple scattering all the impinging light spectral components are usually evenly diffused, which makes the diffused light to take the same color as that of the source (typically white). Since the probability of multiple scattering, for a given wavelength and propagation direction, depends only on T($\lambda$), being maximum when Transmittance is zero, minimizing multiple scattering implies working in high Transmittance regime, which may cause a drawback on the efficiency.

Surprisingly, it has been found that conditioning the transmission in a given direction by the constraint:

"T(450 nm)$\geq T_{min}$, $T_{min}$=0.4, for example $T_{min}$=0.5, such as $T_{min}$=0.6"

limits multiple scattering within acceptable limits, in the sense that the diffuse light maintains the natural sky-like characteristic tinge, while presenting a scattering power as large as 60% in the blue. Notably, since a beam propagating in a different direction with respect to the diffuser orientation might experience a longer path inside the diffuser, which implies a lower Transmittance, the condition T(450 nm)$\geq T_{min}$ is considered as valid only for the specified propagation direction. A propagation direction which fulfills the condition T(450 nm)$\geq T_{min}$ is called in the following: "high-Transmittance direction". The diffuser is operated as a noon skylike diffuser when the impinging light beam propagates in the diffuser in the high Transmittance direction.

The third optical property of a nanodiffuser of an embodiment is designated here as "sunset skylike diffusion". This is a further optical property that the nanodiffuser satisfies in order to correctly simulate the diffusion of the sun light operated by the sky in nature, and specifically it refers to the capability of the diffuser to scatter the impinging white light by producing the colors of the sky at sunset (or sunrise), i.e. when the sun is close to the horizon. In this condition, the distinguishing feature of the process is that the colors change from the blue to the red depending from which particular position in the sky the light is diffused. This request rises immediately a problem, since even the lowest Transmittance admitted for the purpose of avoiding relevant multiple scattering, T(450 nm)$\geq$0.4, is too high to ensure that all colors except for orange-red are scattered away, as it is done to adequately reproduce the sky at sunset. In other words, obtaining orange-red from light scattering implies to operate in multiple scattering regime. The question is then how to prevent multiple scattering from spoiling the spectacular sunrise/sunset color distribution. In nature the problem is solved by the curvature of the sky, which implies that the different portions of the sky seen by the observer are illuminated by sun rays which have traveled different path lengths of sky. In other words, at sunset the observer sees red at the horizon, since the atmosphere scatters the residual light from the low sun which has crossed a long path in the low sky, while the observer sees blue at the Zenith, since the high atmosphere scatters toward us the sun beams which have crossed only a short path in the sky. A first option, therefore, is that of imitating nature by producing a diffuser having suitable curvature. This option, however, presents several technical difficulties. Among the other, one should not forget that while in nature sunbeams easily enter the sky at low incidence angle, here the problem of extremely high reflections may appear due to the fact that the diffuser embedding matrix has a refraction index different from that of air. This problem may be solved by embedding the curved diffusing element into a parallelepiped transparent matrix, made of the same matrix material in which nanoparticles are dispersed. In this case, since the average refraction index of the matrix and of the nanodiffuser are virtually identical, the reflection of light at the curved diffuser interface is removed. This setting allows reconstruction of the sky in sunset mode, according to an embodiment.

A further scheme is disclosed here, in two different geometries, which surprisingly allows to operate a diffuser homogeneously filled with nanoparticles in strong multiple scattering regime, while preserving the purity of the color distribution of the sky at sunrise/sunset. This is achieved by a diffuser which has low Transmittance in the propagation direction, and particularly $T(\lambda) \ll 1$ for $\lambda \leq 570$ nm, i.e. for all wavelength components except for orange and red, but large Transmittance in one or both the orthogonal directions, and more precisely $T_\perp(450 \text{ nm}) \geq 0.4$, for example $T_\perp(450 \text{ nm}) \geq 0.5$, such as $T_\perp(450 \text{ nm}) \geq 0.6$.

In a first embodiment, a nanodiffuser is shaped as a long and narrow cylinder, with a length L much larger than the diameter, $\Phi$, and which is illuminated along its axis. More precisely, the cylinder has $L > 10\Phi$, for example $L > 20\Phi$, such as $L > 30\Phi$. In this case the diffuser may be made to have high Transmittance in both the orthogonal directions, and low Transmittance in the propagation direction. Setting $T(\lambda) \leq 0.5$, for example $T(\lambda) \leq 0.3$, such as $T(\lambda) \leq 0.1$ for $\lambda \leq 570$ nm in the propagation direction, strong multiple scattering will take place, and only orange-red photons will reach the end of the diffuser. An observer that looks at the diffuser by the side, however, will see dominant blue light emitted close to the entrance of the cylinder, followed by a greenish, yellowish and finally an orange and red tinge along the entire length of the diffuser, different dominant colors being scattered from different portions of the diffuser, according to the scope of an embodiment. Notably, if all diffused light was mixed, it would be indeed almost white. However, since different colors are scattered by different portions of the diffuser, they will be perceived separately by the observer. It is noted that the condition for the diffuser to be optically thin in the orthogonal direction, so that every time one photon is scattered it leaves the diffuser and it cannot be scattered again, is relevant to achieve the desired chromatic separation. In fact, if the diffuser is thick also in the orthogonal directions, showing for example $T_\perp(450 \text{ nm}) < 0.4$, a blue photon scattered, for example, close to the entrance of the diffuser may be redirected along the cylinder axis by a second scattering event, and finally be scattered out at the very end of the cylinder, eventually overlapping with a red photon which is scattered for the first time, thus creating a white diffused light, which is not desired for a nanodiffuser according to an embodiment.

In a second embodiment the diffuser is shaped as a flat panel, whose length (L), height (H) width (W) fulfill $L \geq H \gg W$. Notably, here the panel is illuminated from one side, so that the light beam propagates along the L direction. It is noted that the propagating beam may be guided inside the panel due to total internal reflection, as it is also possible for the cylinder, with the exception of the component which is scattered out of the diffuser due to the presence of nanoparticles. In this panel embodiment, as opposed to the previous case of the cylinder, the diffuser is optically thin only in one of the two orthogonal directions. As a consequence, a photon which is scattered in the plane of the diffuser may be scattered again in the same plane several times. However, since this scattered photon has a polarization orthogonal to the panel (i.e. along W), the probability that it is scattered out of the diffuser is very low. As a consequence, the probability that photons of different colors leave the same portion of the diffuser is again low, which may guarantee the necessary conditions for the panel to reproduce a spectacular reconstruction of the chromatic distribution of the sky at sunrise/sunset, according to an embodiment.

There are a few configurations of this second embodiment here addressed which are remarkable for applications.

(i) For what concerns the dimensions of the panel, it may be convenient to operate with $L > 10$ W, for example $L > 20$ W, such as $L > 30$ W.

(ii) For what concerns surface quality, the two panel large faces are virtually free from scratches, digs, bubbles or any other defect, since these defects will become visible when the light is guided inside the panel. In general, the quality of the panel surfaces typically guarantee that the scattering produced by the surface on the internally guided light is less than 15%, for example than 5%, such as than 1% than the scattering produced by the nanoparticles. The test may be performed by comparing the luminosity of the diffuser with and without nanoparticles.

(iii) A particular arrangement of the panel nanodiffuser comprises inserting into the diffuser or coupling to the diffuser from one side a light source, or an array of light sources, as for example an LED array, as depicted in FIG. 1. The light from the LED is partially guided inside the panel via total internal reflection and partially scattered out of the diffuser panel by means of the action of the nanoparticles. Inserting a light source into the diffuser or coupling it to the diffuser is not to be considered as an option limited to the specific panel diffuser described in the present example, but it refers to all the diffusers considered by an embodiment, such as, for example, the cylinder diffuser described in the previous embodiment.

(iv) In a further configuration, the panel is applied on a mirror surface, or has a high-reflectivity coating deposited on one of the two largest faces. This option may be convenient if the panel has to be used as a furnishing element. In this case, as specified in the measurement method described in the present description, the Transmittance across the diffuser may still be measured, in reflection, obtaining as a result the value relative to twice the thickness of the panel. However, in the presence of a mirror applied on the panel, the optical thickness which needs to be considered with respect to the limitations imposed by multiple scattering is indeed twice the thickness of the panel. In other words, the panel will behave in respect to the multiple scattering as if its thickness was twice. Therefore the measurement of double pass Transmittance is correct in this regime. It is noted that this reasoning concerning the implementation of a mirror surface on the nano-diffuser does not apply only to this specific configuration, but to all nano-diffusers according to an embodiment.

With respect to the problem of multiple scattering which is addressed in this paragraph, it has surprisingly been found that a single condition may suffice for guaranteeing a generic nanodiffuser optical element to be adequate for reproducing the light scattered by the sky both for noon-type and sunset-type regimes. This condition is that there exists at least one propagation direction inside the nanodiffuser for which:

$$T(450 \text{ nm}) \geq T_{min}, T_{min}=0.4, \text{ for example } T_{min}=0.5, \text{ such as } T_{min}=0.6$$

If the diffuser is illuminated along this high-Transmittance direction it means that it is operated as a noon skylike diffuser. In contrast, if it is illuminated along an orthogonal direction, over which the Transmittance is lower, then it means that the diffuser is operated as sunset skylike diffuser.

The fourth optical property which characterizes a sky-sun diffuser of an embodiment is that of being able to scatter the impinging light beam with a scattering efficiency comparable to that of the sky, so that when an object or a scene is illuminated by both the transmitted (sun-like) and diffused (sky-like) light components, the balance between the two components corresponds to what occurs in nature. It has been evaluated that in a typical spring day, in the early afternoon, with clear skies and at a subalpine latitude in Italy, the sky contributes for at least 20% of the outdoor luminosity, the rest being due to the transmitted light of the sun, the figure increasing to 40-50% in late afternoon. By assuming the back scattering to be suitably minimized, the condition to be fulfilled by a nanodiffuser according to an embodiment is that there exists at least one propagation direction inside the nanodiffuser for which:

"$T(450 \text{ nm}) \leq T_{Max}$, where $T_{Max}=0.9$, for example $T_{Max}=0.8$, such as $T_{Max}=0.7$"

The reason why it may be required that the condition be fulfilled for at least one, and not for all the directions inside the diffuser, relates again with the case of a large aspect ratio diffuser, i.e. those shaped as a thin cylinder or as a panel as described for an embodiment. In this case, owing to a very large unbalance between propagation lengths in the orthogonal dimensions, the optimum operating regime may require a fairly high Transmittance in the orthogonal direction. In order to demonstrate the relevance of an embodiment, in what follows are disclosed three possible applications based on a diffuser according to an embodiment, or on a set of diffusers according to an embodiment, and of different types of obscurants.

The first application is based on the combination of a sunset-mode panel according to an embodiment and an obscurant which covers completely one of the two large faces of the panel. The presence of the obscurant is beneficial in order to let an observer to see the light scattered by the diffuser against a dark background, and also in order to maximize color fidelity. In fact, in nature the sky is always seen against a dark background, which is the empty space among the stars. The use of an obscurant surface may be beneficial also when a diffuser is meant to be used in skylike noon mode. In this case, the observer does not have the possibility to observe the light of the source transmitted by the diffuser. However, the observer may position himself/herself on the same side as the light source, and observe the diffuser in back-scattering mode. In this case the presence of the obscurant is mandatory to appreciate the effect, unless the diffuser panel is seen by the observer against a naturally dark background. This is the case, for example, when the diffuser is used as a domestic window over a dark night scene. In this case an observer inside an illuminated apartment will perceive the backscattered light from the panel, which will appear as the light from the sky. It should be remarked that if the obscurant is applied onto the diffuser, it may be impossible to measure the Transmittance in at least one propagation direction. Therefore the obscurant may be removed in order to verify if the diffuser fulfills the conditions of an embodiment by means of a measurement technique proposed in the present description.

A second application concerns the use of the nanodiffuser for modifying the spectrum of the transmitted light, i.e. as a sun-color filter capable of transforming the light of a conventional source, for example a theater light, making it to assume the color of the light of the sun transmitted through the atmosphere. In this application, the scattered light is entirely absorbed, the scattering mechanism remaining, however, possibly being essential for the sun-like colors to appear.

For achieving the effect, it may be mandatory for multiple scattering to not contribute to the light which is sent to the scene. This goal may be achieved by using, for example, the cylinder configuration described in an embodiment, where the lateral surface of the cylinder may be covered by an obscurant surface. However, the request of having a length much larger than the diameter, $L \gg \Phi$, may make the device inconveniently long, for example, for applications related to theater lights, whose diameter is typically few tens of centimeters large. Here are disclosed two solutions where the contribution of multiple scattering on the light sent to the scene is removed, while keeping the device very compact. The result is achieved either by inserting obscurants inside the diffuser, or by combining separate diffusing and absorbing elements, as illustrated in the following description.

Figure 2:
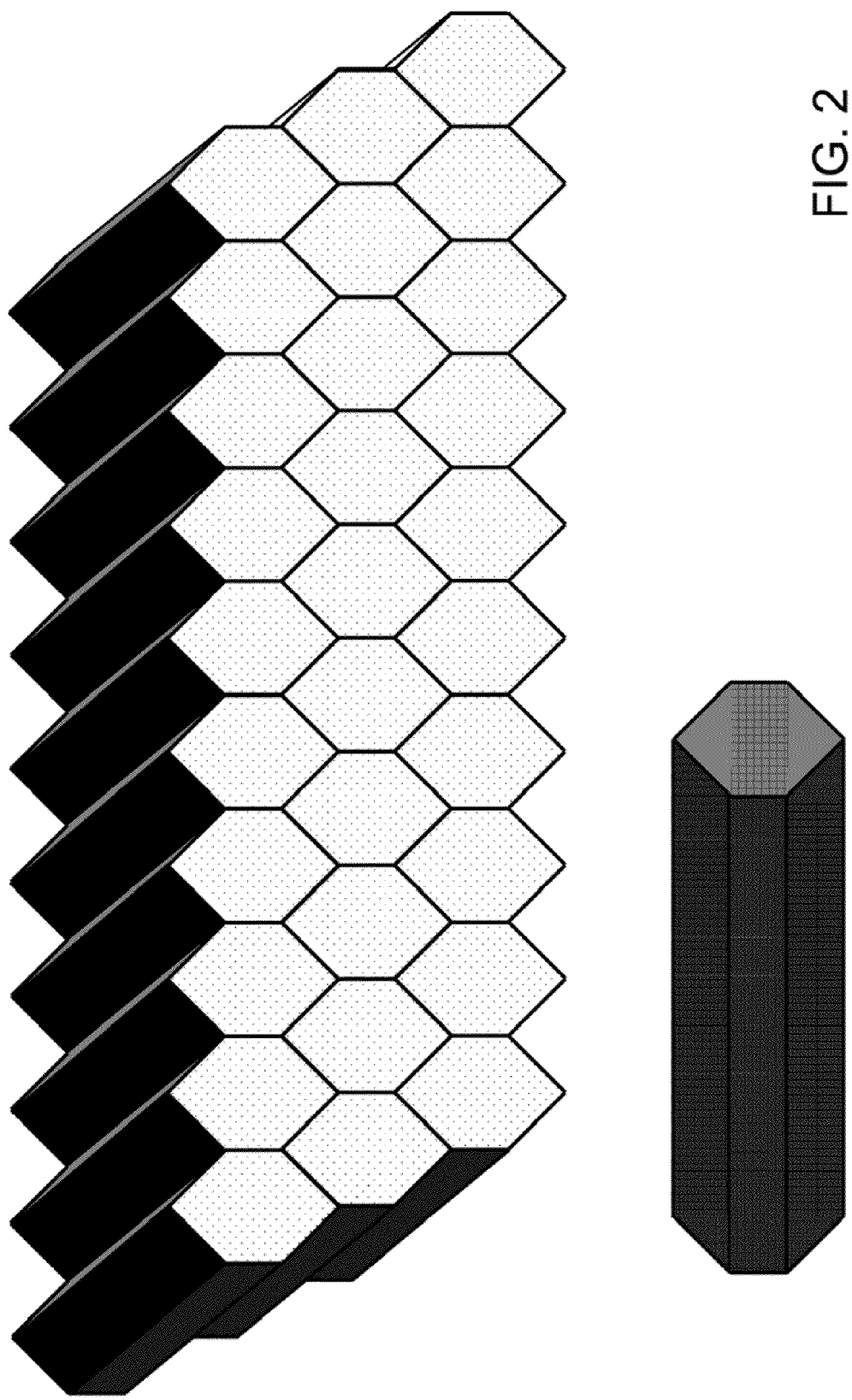
FIG. 2 shows the construction of a sun-color filter, composed by a plurality of individual nano-diffusers according to an embodiment, joined in a multi-channel structure where each diffuser is separated from the others by an absorbing interface which absorbs all the scattered light. Details of the absorbing interface are shown at the bottom of the figure.

The first solution for the sun-color filter comprises the usage of a multi-channel diffuser, which means an assembly of a plurality of parallel, individual diffusing elements, each one individually fulfilling a condition of an embodiment, which are joined together, for example, in a honeycomb-like configuration, as shown in FIG. 2, and where each individual element is separated from the others by means of an obscurant surface, whose details are shown at the bottom of FIG. 2. In this configuration, the condition for which the sun-color filter performs without sending scattered photons in the direction of illumination coincides with the request that each element operates free from multiple scattering in the direction orthogonal to the propagation direction, which is the condition $T(450 \text{ nm}) \geq T_{min}$, $T_{min}=0.4$, for example $T_{min}=0.5$, such as $T_{min}=0.6$ of an embodiment. Notably, by using a sufficiently high filling fraction, this condition may be reached with very thin diffusing elements, and thus very short in the propagation direction, which allows for very compact multi channel sun-color filters to be developed. Since a characteristic of an embodiment refers to each of the constituting elements of the multichannel sun-color filter, the filter is disassembled if a condition of embodiment is to be tested by means of the measurement technique proposed in present description. Notably, all the tinges of the natural sunlight which vary in the different hours of the day may be obtained simply by adding in series a plurality of multi-channel sun-color filters here disclosed.

In the second solution for the sun-color filter, the same effect may be obtained using a combination of a plurality of thin diffusing disks and of 3-dimensional absorbing multi-channel structures. Here each elementary disk is a diffuser according to an embodiment, and precisely a diffuser operated as a noon skylike diffuser, which means showing $T(450 \text{ nm}) \leq T_{Max}$ in the propagation direction. The absorbing elements comprise a plurality of thin parallel empty channels, which may perfectly transmit light in the propagation direction but which may also absorb all components propagating off axis. The device operates using an alternate sequence of thin diffusing disks and obscurant grids in between. By means of this setting, all photons which are scattered once in each disk diffuser will hit an absorbing wall in the grid beyond it, thus preventing the possibility of a second scattering event in the further diffusing element placed beyond the absorbing grid. In doing so, only the genuine transmitted photons exit the device, the produced light assuming the pure color as that of the sun. Increasing the number of diffusers and grid pairs, all the changes in the tinge of the sun light in different hours of the day may be reconstructed with high fidelity. It is noted that this arrangement allows to add/remove grids separately from the diffusers. Therefore it may allow to tune the amount of scattered photons which are sent to the scene in a similar manner as it happens in nature when the light from the sun passes through small holes in the clouds at the horizon, which is seen to increase the saturation of the color of sunlight. This option therefore may allow for the addition of a further degree of freedom useful for increasing the fidelity in the reproduction of sun light.

Figure 3:
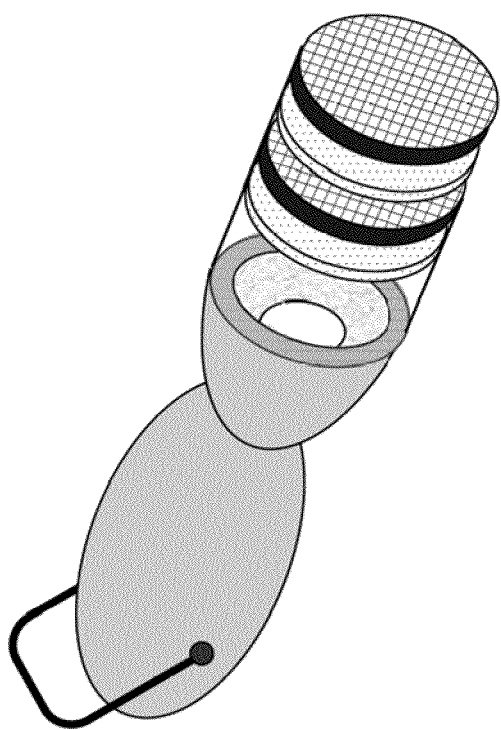
FIG. 3A illustrates a particular layout where a plurality of sun filters working on the basis of the principle illustrated in FIG. 2 is used in order to vary the tinge of the artificial sun light.
FIG. 3B shows the layout where a plurality of noon skylike diffusers according to an embodiment and of absorbing multi-channel structures are combined to obtain a sun filter with variable optical density and controlled multiple scattering, said noon skylike diffusers being described at page 7 of the present description
Figure 3:
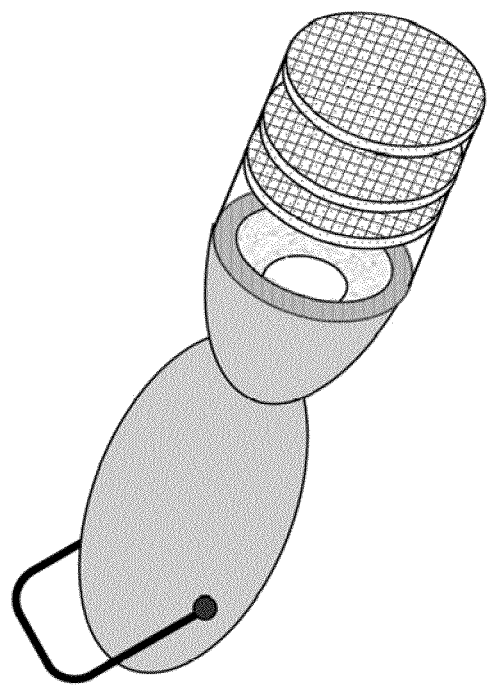

The layout relative to an embodiment where the nanodiffuser material is cast inside the absorbing multi-channel structure is shown in FIG. 3A, while the layout relative to an embodiment where the absorbing grids are placed in between standard nano-diffuser disks is depicted in FIG. 3B.

Microscopic structural properties of the diffuser are disclosed here below. A set of four relevant structural parameters concerning the nanoparticles dispersed in the solid matrix is defined. Also defined are their relevant ranges for which the desired optical properties of a diffuser of an embodiment may be guaranteed. Said parameters are:

(i) m: the ratio between the particle and host medium refractive indexes, $$m \equiv \frac{n_p}{n_h}.$$

In the following it is considered as adequate those values falling in the range $0.5 \leq m \leq 2.5$, for example $07 \leq m \leq 2.1$, such as $0.7 \leq m \leq 1.9$, where the range $0.95 \leq m \leq 1.05$ is excluded in some or all cases being in this case the index of the host matrix and of the nanoparticle too close for providing sufficient scattering.

(ii) D[meters] the effective particle diameter, $D=dn_h$, where d[meters] is the average particle size defined as the average particle diameter in the case of spherical particles, and as the average diameter of volume-to-area equivalent spherical particles in the case of non spherical particles, as defined in [T. C. GRENFELL, AND S. G. WARREN, "Representation of a nonspherical ice particle by a collection of independent spheres for scattering and absorption of radiation". Journal of Geophysical Research 104, D24, 31,697-31, 709. (1999), which is incorporated by reference]. The effective particle diameter is given in meters or, where specified in nm.

(iii) N[meters$^{-2}$]: the number of particles per unit area seen by the impinging beam propagating in the given direction;

(iv) f: the volume filling fraction occupied by the nanoparticles, where $$f = \frac{4}{3}\pi\left(\frac{d}{2}\right)^3 \rho$$

and $\rho$[meters$^{-3}$] is the particle number density (number of particles per unit volume).

It is noted that the diffuser length L [meters] does not appear explicitly but it may be univocally determined by the chosen set of parameters, being $L = N\rho^{-1}$ and $$\rho = \frac{f}{\frac{4}{3}\pi\left(\frac{d}{2}\right)^3}$$

The domain in the m,D parameter space for which $5 \geq \gamma(m,D) \geq \gamma_{min}$ is discussed in the following.

The Transmittance of a nano-diffuser in a direction for which the light beam sees in its path NA particles, where A[meters$^2$] is the beam cross section, is $T(\lambda) = \exp[-Nc_{scat}(\lambda)]$, where $c_{scat}(\lambda)$ is the single particle scattering cross section. According to the established Mie-scattering theory, the single-particle scattering cross section depends only on wavelength, index mismatch, and effective diameter, $c_{scat}(\lambda,m,D)$. Since $\gamma = \text{Log}[T(450 \text{ nm})]/\text{Log}[T(630 \text{ nm})]$, it follows that also $\gamma$ depends only on index mismatch, and effective diameter, being $$\gamma(m, D) = \frac{c_{scat}(450 \text{ nm}, m, D)}{c_{scat}(630 \text{ nm}, m, D)}.$$

Figure 4:
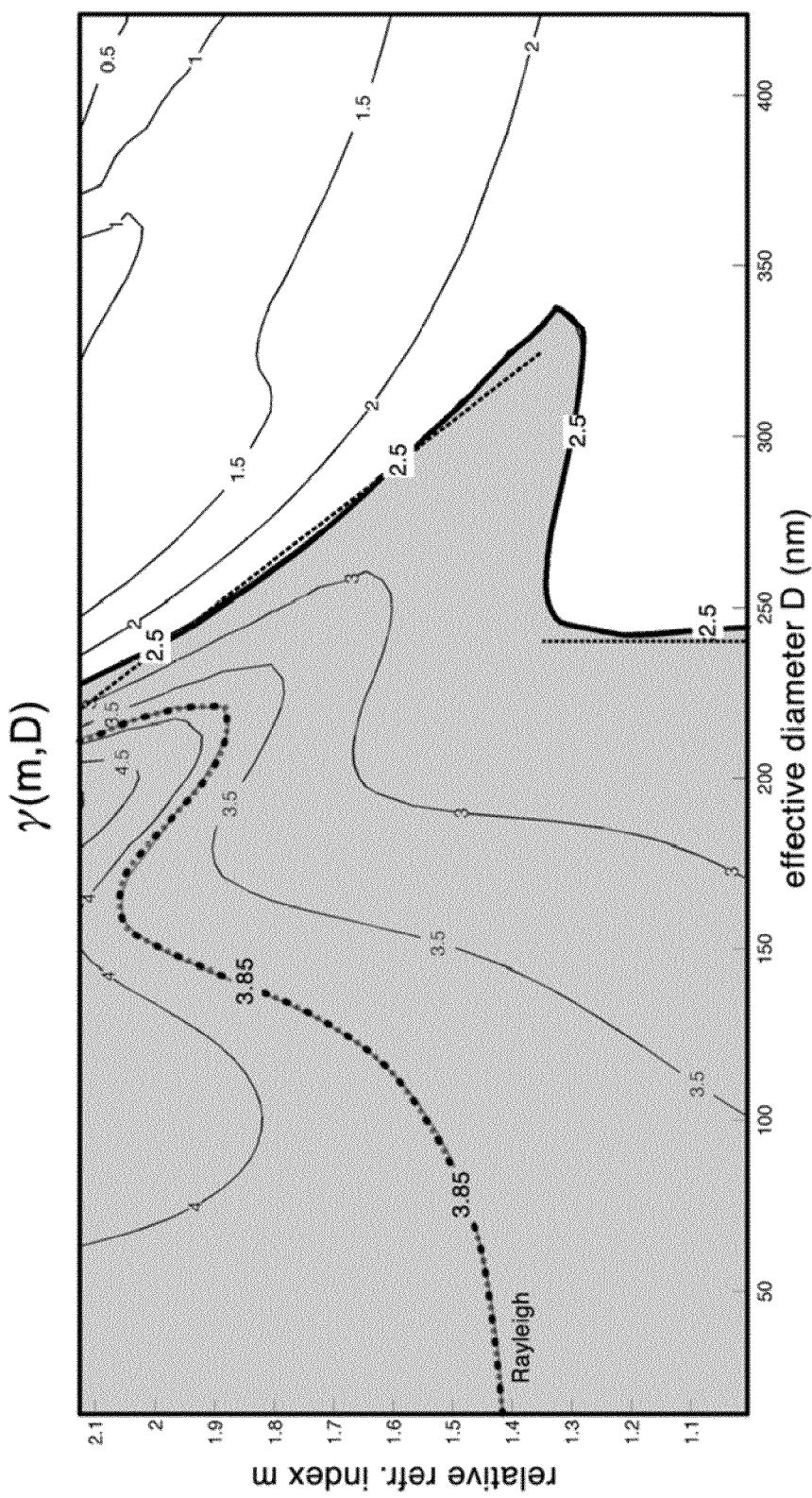
FIG. 4 shows the contour plot of the function $\gamma(m,D)$, where m is the relative refraction index and D the effective diameter defined in the present description.

In FIG. 4 the $\gamma(m,D)$ contour is plotted. The curve $\gamma(m,D)= 2.5$ is drawn in bold. The domain here represented is the $1.05 < m \leq 2.1$ and $11 \text{ nm} \leq D \leq 420$ nm space. The region where $5 \geq \gamma(m,D) \geq 2.5$, which may be adequate for purposes of an embodiment, is highlighted as grey area on the left of the $\gamma(m,D)=2.5$ curve. The curve $\gamma(m,D)=3.85$, which correspond to the Rayleigh limit, is drawn as a dotted line.

The curve $\gamma(m,D)=2.5$ is fitted in order to have an analytical expression for the m,D pairs in the selected area fulfilling $5 \geq \gamma(m,D) \geq 2.5$. Expressing D in nm the fit gives:

For $0.7 \leq m \leq 0.95$, $D \leq -132 m + 115$; For $1.05 \leq m < 1.35$, $D \leq 240$; For $1.35 \leq m \leq 2.1$, $D \leq -135 m + 507$;

In a first test, the quantity $T(\lambda) = \exp[-Nc_{scat}(\lambda)]$, which gives the spectral profile of the transmitted light for the case of an impinging light with constant spectral intensity for all wavelengths, has been computed for a number of m,D pairs inside and outside the selected area. The resulting spectral distribution has been transformed in RGB amplitudes according to [A. STOCKMAN AND L. T. SHARPE Vision Research vol. 40, 1711-1737 (2000), which is incorporated by reference] for providing eye-like visualization of the spectrum. The result confirms that while for $5 \geq \gamma(m,D) \geq 2.5$ on increasing N, the transmitted light changes its color from white, to yellowish, to orange and finally red, in accordance to what is expected for a correct reconstruction of the Transmittance of the atmosphere, for $2.5 \leq \gamma(m,D) \leq 0$ the transmitted light showed much less saturated tinges, featured by the appearance, for example, of bluish/pink tonalities.

In a second test the angle-resolved differential cross section $c_{scat}(\theta, \lambda)$ was calculated. In the condition where multiple-scattering and high filling fraction effects are negligible, this quantity gives the spectral profile of the light scattered by the diffuser for each selected angle, $\theta$. These spectra have been transformed in RGB amplitudes for providing eye-like visualization of the spectrum. The corresponding polar color maps are re-drawn in the form of contour areas to allow black and white data representation.

Figure 5:
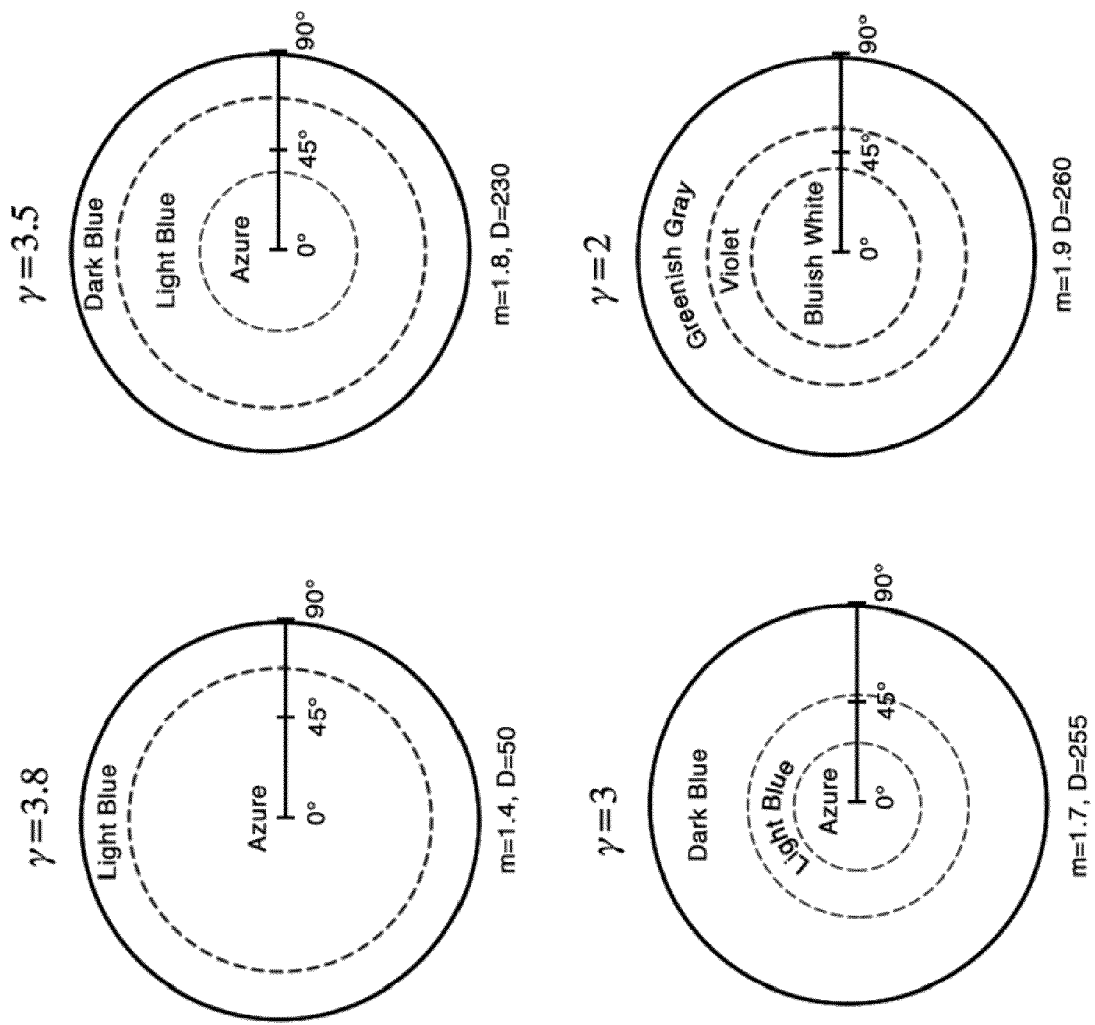
FIG. 5 shows the calculated, angularly resolved, scattering color maps, for four m,D pairs and corresponding $\gamma(m,D)$ values.

FIG. 5 shows the calculated, angularly resolved, scattering color maps, for four m,D pairs. The result are presented only for positive angles, $0° \leq \theta \leq 90°$, i.e. for forward scattering, because in the Rayleigh limit forward and backward scattering are identical, while on moving away from this limit the scattering tends to become almost only in the forward direction.

(i) The first case, which refers to m=1.4, D=50 nm, $\gamma$=3.8, represents the Rayleigh limit, featured by the azure scattering over all directions, the scattering being slightly less efficient for angles close to 90 deg.

(ii) The second case, which refers to m=1.8, D=230 nm, γ=3.5, represents a case for which, in spite of the much larger effective diameter, γ is still very close to the Rayleigh limit. Apart from the fact that the scattering has become slightly more forward, the result shows a color distribution barely distinguishable from the previous case.

(iii) The third case, which refers to m=1.7, D=255 nm, γ=3, represents a case for which, in spite of the small change in m,D values with respect to the previous case, γ takes a significantly lower value, while remaining however within the selected area. The result shows that the color distribution is still that characteristic of the noon sky diffusion, but the scattering has become strongly forward, being limited in the 0°≦θ≦45° cone. Notably, a number of applications where a nanodiffuser of an embodiment is used for artificial-lighting installations, benefits from the fact that large-angle scattering is quenched, since this may represent a loss for the illumination system.

(iv) The fourth case refers to m=1.9, D=260 mm, γ=2. In spite of the small change in m,D values with respect to the previous case, γ has dropped significantly, being now outside the selected area. The result shows that the sky-like azure and light-blue tinges totally disappear. The cone 0°≦θ045°, where the scattering is more intense, is now populated by a whitish-bluish light, where color saturation is very poor. The outside 45°≦θ≦90° cone shows greenish and violet-grey tinges, totally incompatible with the natural color of sky-light.

Surprisingly, accordingly to the reported results from the two set of numerical tests, what was found is that, in the chosen m,D range, the extremely simple condition 5≧γ(m, D)≧2.5, which is calculated only on the basis of two values for the diffuser Transmittance at two selected wavelengths, may permit an accurate discrimination of the nanodiffuser quality not only for what concerns the diffuser capability of reproducing a high-fidelity sun-like Transmittance in the entire visible spectrum, but also for reproducing a high-fidelity sky-like diffusion spectrum, the latter property having been selectively verified for each different scattering angle.

The conditions on particle number per unit surface, $N \leq N_{Max}$ and $N \geq N_{min}$, fulfilling $T \geq T_{min}$ and $T \leq T_{max}$, respectively are discussed in the following.

By computing diffuser Transmittance, $T(\lambda)=\exp[-Nc_{scat}(\lambda)]$, accordingly to Mie theory, it is obtained for λ=450 nm and D in [meters]

$$N = -4 \times 10^{-28} \frac{\ln(T)}{D^6} \left|\frac{m^2+2}{m^2-1}\right|^2 \text{ [meters}^{-2}]$$

(i) The condition T(450 nm)≧$T_{min}$, $T_{min}$=0.4, for example $T_{min}$=0.5, such as $T_{min}$=0.6, translates into $$N \leq N_{Max} = -4 \times 10^{-28} \frac{\ln(T_{min})}{D^6} \left|\frac{m^2+2}{m^2-1}\right|^2 \text{ [meters}^{-2}]$$

For example, for $T_{min}$=0.4, it is obtained $$N_{max} = \frac{3.7 \times 10^{-28}}{D^6} \left|\frac{m^2+2}{m^2-1}\right|^2 \text{ [meters}^{-2}]$$

Figure 6:
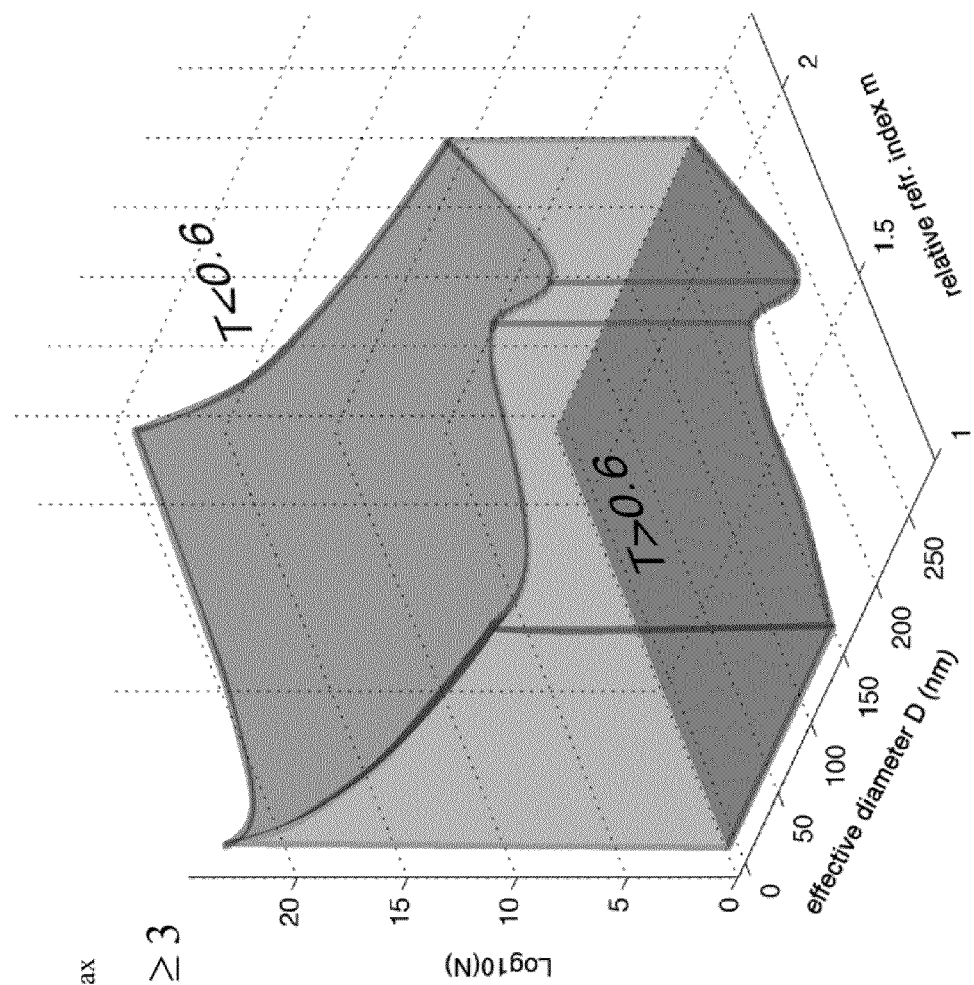
FIG. 6 shows the volume in the (m,D,N) space corresponding to the case $5 \geq \gamma(m,D) \geq 3$ and $0 \leq N \leq N_{max}$ where N is the total number of particles per unit area seen by a light beam propagating in a given direction and $N_{max}$ is defined in the present description.

For example, FIG. 6 shows the volume in the (m,D,N) space corresponding to the case 5≧γ(m,D)≧3 and 0≦N≦$N_{max}$ for the case of $T_{min}$=0.6, (and for 1.05≦m≦2.1, 11 nm≦D≦410 nm)

(ii) The condition T(450 nm)≦$T_{Max}$, $T_{Max}$=0.9, for example $T_{Max}$=0.8, such as $T_{Max}$=0.7, translates into $$N \geq N_{min} = -4 \times 10^{-28} \frac{\ln(T_{Max})}{D^6} \left|\frac{m^2+2}{m^2-1}\right|^2 \text{ [meters}^{-2}]$$

For example, for $T_{max}$=0.9, it is obtained $$N_{min} = \frac{4.24 \times 10^{-29}}{D^6} \left|\frac{m^2+2}{m^2-1}\right|^2 \text{ [meters}^{-2}]$$

Figure 7:
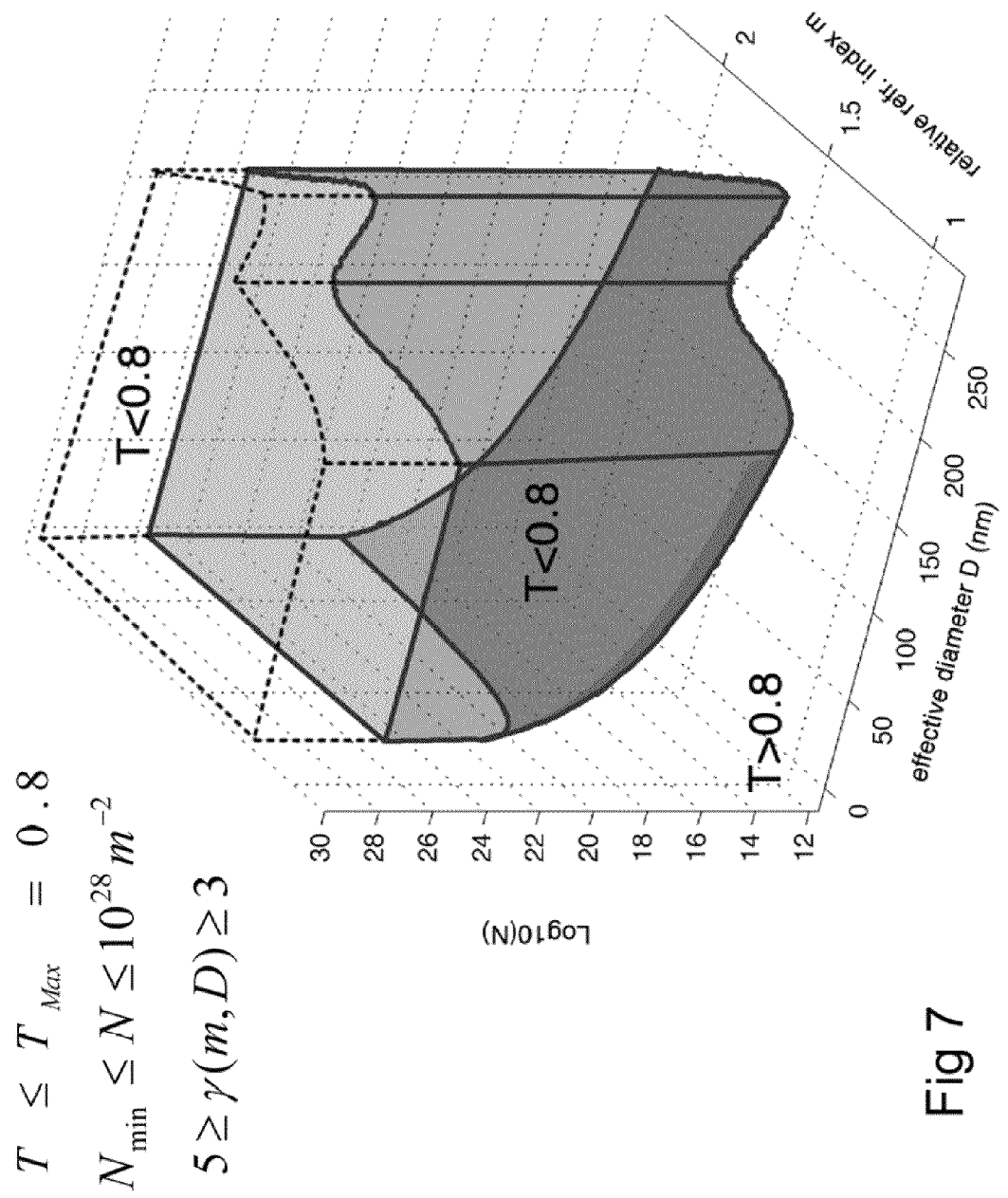
FIG. 7 shows the volume in the (m,D,N) space corresponding to the case $5 \geq \gamma(m,D) \geq 3$ and $N_{min} \leq N \leq 10^{28}$ m$^{-2}$ where $N_{min}$ is defined in the present description.

For example, FIG. 7 shows the volume in the (m,D,N) space corresponding to the case 5≧γ(m,D)≧3 and $N_{min}$≦N≦$10^{28}$ m$^{-2}$ for the case of $T_{Max}$=0.8 (and for 1.05≦m≦2.1, 11 nm≦D≦410 nm)

The condition on maximum volume filling fraction, f is discussed in the following.

The final effect here considered is that related to the presence of high volume-filling-fraction, f. By increasing f, the distribution of nanoparticles in the nanodiffuser loses its randomness, and the particle positions become correlated. As a consequence, the light scattered by the particle distribution experiences a modulation which depends not only on the single-particle characteristics, as predicted by the Mie theory, but also on the so called "structure factor" $S_\lambda(\theta)$, which is the Fourier transform of the pair correlation function. The effect of high filling fraction is that of severely depleting the scattering efficiency. Moreover, especially for smaller particle sizes, it impacts also the dependence of scattering efficiency on wavelength, and on angle as well. In order to avoid these "close packing" effects, it may be recommended to work with filling fractions f≦$10^{-1}$, for example f≦$10^{-2}$, such as f≦$10^{-3}$.

A nanodiffuser according to an embodiment is a solid optical element which comprises a transparent solid matrix embedding a dispersion of transparent nanoparticles, whose average size d is in the range 10 nm≦d≦240 nm. The optical element may have any shape, and volume. As list of possible examples, it is mentioned that it may be shaped as a parallelepiped, with any ratio among the length of different axis, thus including the case of panels and films, but it may be shaped as well having curved surfaces, i.e. as a cylinder, which may be completely filled or empty inside. It may be shaped as a tube, which may be straight or bent, or as a fiber. It may be also shaped as a lens. Moreover, it may comprise an assembly of different elements, which may comprise different materials. The dispersion of nanoparticles in the embedding matrix may be homogenous, or it may present, for example, gradients in filling fractions. In the case of gradients or non homogeneities, the limits on the highest filling fraction discussed in the Optical section above are intended to be referred to the highest filling fraction present in the diffuser. Note that all other quantities defined in the Optical section of above are average quantities, which therefore refer to the nanodiffuser as a whole, and are correctly defined also in the presence of a relevant non homogeneity of the considered diffuser.

Particularly, four shaping embodiments are

1. Macroscopic single component: an optical element comprising a uniform organic/inorganic matrix in which inorganic/organic nanoparticles are homogenously dispersed.

2. Heterogeneous conglomerate: an optical element comprising a uniform organic/inorganic matrix in which beads of nanocomposite material are included, where beads may have any shape and dimension in the 1-$10^3$ μm, for example 1-$10^2$ μm, such as 10-$10^2$ μm ranges, and may be made using the same or a different matrix material, provided that the difference in refractive index between the two embedding matrices is sufficiently small to prevent beads to create undesired light scattering, reflection, refraction or diffraction. Moreover, the filling fraction featuring the beads may be sufficiently low to prevent those effect related to high filling fraction, illustrated in the present description, to take place.

3. Film: an optical element comprising a film of nanocomposite material, which may be supported by a frame or an external support, 4. Bi-component: an optical element comprising a substrate on top of which a film of nanocomposite material is deposited.

Figure 8:
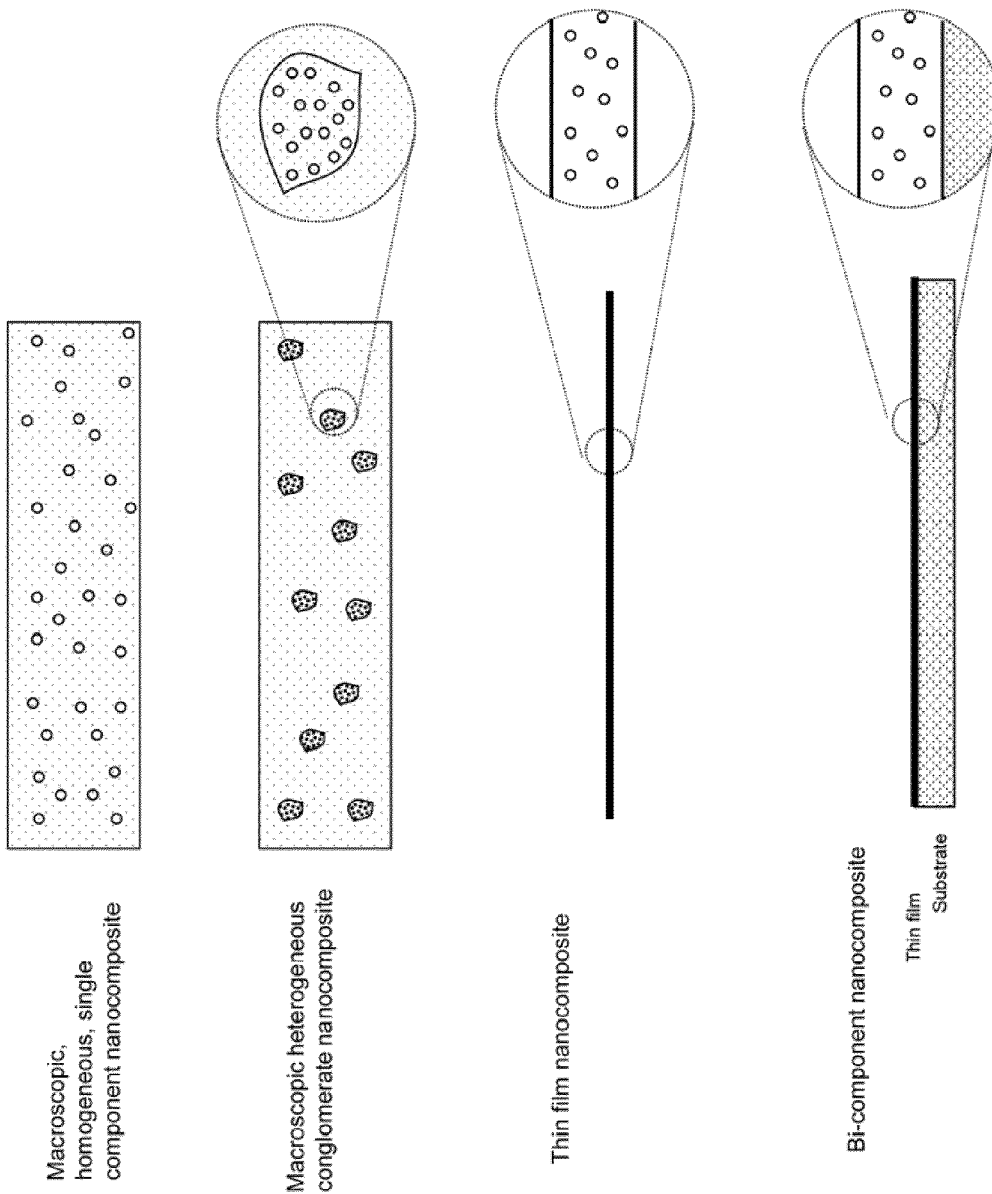
FIG. 8 schematically illustrates few examples of the possible macroscopic morphology of the nano-diffuser according to an embodiment.

Few examples are reported in FIG. 8.

The matrix may be either organic or inorganic.

Organic matrices suited for a purpose of an embodiment are those that include, but are not limited to, the following:

Polymers obtained by polymerization and copolymerization of one, two or more monomers belonging to the following classes:

Class I Monofunctional Acrylic Monomers such as Acrylic Monomers: Methyl Acrylate (MA), Ethyl Acrylate (EA), Butyl Acrylate (BA), n-butyl acrylate (nBA), iso-butyl acrylate (iBA), t-butyl acrylate (tBA), 2-ethyl hexylacrylate (EHA), Methyl Methacrylate (MMA), ethyl methacrylate (EMA), n-butyl methacrylate (nBMA), isobutyl methacrylate (iBMA), t-butyl methacrylate (tBMA), Lauryl Acrylate (LA), diethylene glycol bis(allyl carbonate);

Class II Bifunctional Acrylic Monomers such as. Diethylene Glycol Diacrylate (DEGDA) Triethylene Glycol Diacrylate (T3EGDA) Tetraethylene Glycol Diacrylate T4EGDA Polyethylene Glycol Diacrylate (P9EGDA), Ethylene Glycol Diacrylate (EGDA), Butane Diol Diacrylate (BDDA), Hexane Diol Diacrylate (HDDA) Decamethylene Diol Diacrylate (DMDDA), NeoPentyl Glycol Diacrylate (NPGDA)

Class III Trifunctional Acrylic Monomers such as: trimethylolpropane trimethacrylate, trimethylolpropane triacrylate, pentaerythritol triacrylate.

Class IV Tetrafunctional Acrylic Monomers such as pentaerythritol tetraacrylate

Other thermoplastics such as Polycarbonates (PC), Polystyrene, Polyethylene, Polyethylene terephthalate, Other specialty thermoplastics as cyclo-olefin copolymers (COC) containing ethylene, cyclopentene, cycloheptene, cyclooctene, norbornene. Statistical copolymers are amorphous if more than 10-15 mol % of cycloolefins are incorporated in the polymer chain. The glass transition temperature may be varied over a wide range by selection of norbornene as cycloolefin and variation of the amount of norbornene incorporated into the polymer chain. Cycloolefin copolymers are characterized by excellent transparency, high glass transition temperatures of up to 200° C., and excellent long-life service temperatures. They are resistant to polar solvents and chemicals and may be melt processed. Due to their high carbon/hydrogen ratio, these polymers have a high refractive index (1.53 for an ethylene/norbornene copolymer at 50 mol % incorporation).

Other specialty thermoplastics obtained by the homopolymerization and copolymerization of allyl carbonates, like ethylene glycol bis(allyl carbonate) and allyl ethoxyethyl carbonate.

This list may be further expanded by including possible copolymers of the above mentioned materials and also crosslinked polymers.

Inorganic matrices suited for the purpose of an embodiment are those that include, but are not limited to: soda-lime-silica glass, borosilicate glass, fused silica etc.

Transparency may be fundamental when choosing an appropriate matrix for the sky-sun diffuser of an embodiment. The transparency of the matrix may be preferentially very high with respect to both the total amount of power lost in transmission and with respect to distortion in the transmitted spectral profile (the matrix should not preferentially absorb any wavelength, and it may be preferred that the material appears colorless for the thicknesses used for the nano-diffuser under consideration). A relevant example is polymethylmethacrylate (PMMA), which shows an absorption in the visible field of <0.05% for 3 mm of thickness, and polycarbonate (PC), for which an absorption of 2% for 1 mm thickness has been measured (these data refer to products on the market and the light transmittance has been measured with the test method DIN5036). Depending on the desired application, the actual request on matrix transparency may be more or less strict. In fact, materials having the highest transparency might show limitations in other characteristics, for example related to mechanical properties, fire retarding characteristic, etc. In general, what here may be required is that, for a given nanodiffuser optical element, the absorption eventually occurring in the matrix, for a given propagation direction, is small in comparison to the scattering produced on the same beam in the same propagation direction because of the presence of the nano-particle dispersion, where by small it is meant that the absorption of light by the matrix is less than 50%, for example than 20%, such as less than 5% of the scattering produced by the nanoparticle dispersion. The effect of the absorption caused by the matrix does not affect the value of nanocomposite Transmittance as defined by the measurement technique proposed in the present description since the contribution due to absorption is present both in the sample and in the reference channel. The same reasoning applies to the contribution of the reflection of the light at the entrance and exit surfaces of the sample.

The mechanical properties of the organic matrices of the nanodiffuser of the invention may fall within the following ranges:

| | TEST METHODS | RANGES | UNITS |
|---|---|---|---|
| Tensile Strength | ASTM D638 | ISO 527 1-4 | 35-80 | MPa at 23° C. |
| Compressive Strength | ASTM D695 | ISO 604 | 100-130 | Mpa |
| Flexural modulus | ASTM D790 | ISO 178 | 1500-3500 | MPa |
| Flexural Stress at break | ASTM D790 | ISO 527 | 60-130 | MPa |
| Charpy impact (notched) | ASTM D6110 | ISO 179 | 1-15 | KJ/$m^2$ |
| Notched Izod impact | ASTM D256 | ISO 180/1A | 1-20 | KJ/$m^2$ |
| Rockwell hardness | ASTM D785 | ISO 2039-2 | 105-130 | R Scale, MPa |

These ranges of value have been taken from the technical data provided by producers of plastic materials such as Degussa, Rohm, Bayer, Altuglas, etc., and refer to measures taken at a temperature of 23° C. and for thicknesses of few mm.

The nanoparticles have a real refractive index $n_p$ sufficiently different from that of the matrix, in order to allow light scattering to take place. Moreover, the nanoparticles should not absorb visible light, at least in an amount which will appreciably reduce the power and/or change the spectrum (i.e. the color) of the total light exiting the diffuser (i.e. the transmitted+the scattered+the reflected), with respect to the impinging one. The nanoparticles may be either organic and inorganic, the choice depending on the type of matrix. In the case of an organic matrix the most suited nanoparticles are inorganic particles. Organic particles, suited for the application, have an index of refraction too similar to that of the organic matrix, thus leading to a small difference between the indexes of refraction of the two media and to a low scattering efficiency.

Inorganic particles suited for this type of application are those that include but are not limited to ZnO, $TiO_2$, $ZrO_2$, $SiO_2$, $Al_2O_3$ which have index of refraction respectively $n_p$=2.0, 2.6, 2.1, 1.5, 1.7 and any other oxides which are transparent in the visible region. These same particles are also used as fillers for the inorganic matrix.

Organic particles on the other hand may be used with an inorganic matrix and may be made from any of the above-mentioned polymers.

The shape of the nanoparticle may be any, even if spherical particles are preferred. In fact optimization of the optical properties of the diffuser often requires a careful choice of the particle size. When particles with large aspect ratio are used, the dispersion may behave in many respects as polydispersed.

A list of possible synthesis methods is described below.

The best-suited materials to make a diffuser of an embodiment are the ones made from organic matrices, in particular PMMA and PC. PMMA and PC are both plastics that are very easily produced using different methods. As an example PC may be transformed by extrusion, thermoforming and injection moulding, while for PMMA all common processes may be used including injection moulding, compression moulding and extrusion, although the highest quality PMMA sheets may be produced by the so called cell casting process. There are also many other processes that may be used for the production of the sky-sun diffuser, the choice of the process depending mainly on the type of matrix which is being used. The following is a brief list of processes by means of which our sky-sun diffuser may be prepared:

(i) Radical bulk polymerization of acrylic monomers in the presence of the same inorganic oxide nanoparticles, also called industrially "cell casting method". This method is the one that was optimized for the production of prototypes on a laboratory scale.

(ii) Direct mixing dispersion by extrusion. This technique is expected to lead to a cheaper material and faster production (in situ polymerisation can take several days); it may be particularly advantageous when relatively thin foils (mm) have to be produced, and is suitable for the synthesis of polycarbonate nanocomposites, which may lead to fire-retarding performances superior to PMMA and thus to greater impact on the construction industry.

(iii) Emulsion polymerization is the most important method of polymerizing vinyl and acrylic monomers industrially. The polymerization is carried out in water in the presence of water-soluble initiator with monomer micelles stabilized by surfactants. Products generated by emulsion polymerization find usage as coatings or binders in paints, paper, adhesives, textile, floor care, and leather goods markets. Because of their film-forming properties at room temperature, most commercial acrylic ester polymers are copolymers of ethyl acrylate and butyl acrylate with methyl methacrylate. This process is useful for the production of materials having a core-shell morphology comprising a core consisting in an oxide and a polymer shell either covalently bonded to the oxide surface coupling agents by the polymer functions or physically bonded by entanglement. These beads encapsulating the nanoparticles are then used in processes (i) or (ii) in order to produce the bulk nanocomposite.

(iv) Suspension polymerization. In this type of polymerization, monomers are dispersed as 0.1 to 5 mm droplets in water and are stabilized by protective colloids or suspending agents. In contrast to emulsion polymerization, initiation is accomplished by means of a monomer-soluble agent and occurs within the suspended monomer droplet. Water serves the same dual purpose as in emulsion (heat removal and polymer dispersion). The particle size of the final material is controlled through the control of agitation levels as well as the nature and level of the suspending agent. Once formed, the 0.1 to 5 mm polymer pellets may be isolated through centrifugation or filtration. Also in this case it may be possible to obtain core-shell systems.

(v) Thin-film spin coating. Thin films are used as a coating for other optical elements, provided that sufficient matching between thermal expansion coefficients is guaranteed for the application under examination. This process enables to produce films on a laboratory scale and with a maximum thickness of 10 µm.

(vi) Radiation-Induced Polymerization. Nanocomposites may be formed through the application of high energy radiation to either monomer or oligomer mixture. Ultraviolet curing is the most widely practiced method of radiation based initiation; this method finds application in the areas of coating, since relatively thin (few mm) objects are easily polymerised using a photo-initiator (e.g. Benzoin, Benzophenone, 2-Benzyl-2-(dimethylamino)-4'-morpholinobutyrophenone etc.) under UV radiation. This technique has seen wide developments in the past few years since it is a very advantageous process for industrial applications. In fact the photopolymerization process is solvent free, the production rates are high and the energy required is much less than in the case of thermally initiated polymerization processes. This technique has become widely used for the production of films and also of coatings on a variety of substrates. In the case of thick systems electron beam initiated polymerisation is also possible.

Sky-sun diffusers according to an embodiment having an inorganic matrix may be produced, for example, by means of the sol-gel method. There are two different possible approaches:

(i) The production of thin films having thicknesses in the range between 5-20 µm is possible by means of the Doctor Blade process. By means of this process it may be possible only to produce inorganic/inorganic films since at the temperatures involved in the sintering process polymers burn and degrade.

(ii) Bulk materials may also be processed using the sol gel process. As an example the material ORMOCER® (http://www.ormocer.de/EN, which is incorporated by reference) is produced using a process that starts by building up an inorganic network through controlled hydrolysis and condensation of organically modified Si alkoxides. In a subsequent step the polymerizable groups, which are fixed to the inorganic network, react with each other in a thermal or UV-initiated process. In this two-stage process an inorganic-organic copolymer is synthesized. It may also be possible during production to add many fillers to the material, in a variety of forms such as particles. By choosing the most suitable precursor and the desired nanofiller it may therefore be possible to obtain bulk materials having tailored properties.

First Technique: Cell Casting

Cell Casting polymerization is used, for example, for the production of PMMA. Two different approaches are followed to produce the sky-sun diffuser, here described as method A and B.

Method A—Direct Polymerization of Monomer

The steps to obtain a well monodisperse suspension of nanoparticles in MMA comprise:

Purification of the Monomer

MMA produced by Sigma Aldrich, which contains 0-100 ppm monomethyl ether hydroquinone as inhibitor (in order to give the product a longer shelf life) is used. The inhibitor is removed, since it may disturb the polymerization process. In order to do so the monomer is distilled at reduced pressure before use. The distilled monomer then undergoes at least one cycle of freeze and thaw. If kept covered from light and at low temperature (i.e. in a fridge) the distilled monomer may last up to one week.

Another method used for purifying big quantities of MMA is by means of column filtration. A glass column is filled for ⅓ with basic activated alumina. The monomer (MMA) is then added from the top of the column and the clean monomer is collected in a glass container after having passed through the alumina. In this way the inhibitor (monomethyl ether hydroquinone) is removed.

Surface Modification of Particles

Inorganic particles are surface treated in order to increase the compatibility between the two phases (organic/inorganic) and to reduce the surface energy, which due to the high ratio between the surface area of the nanofillers and that of the matrix, plays an important role in the stability of the system. In the literature various surface modification techniques are discussed. Common organic capping agents are thiols with long alkyl chains, which cover the nanoparticle surface and are highly compatible with the monomers. Other possibilities of surface modifications are by chemical reaction of the functionalities present on the surface (i.e silanization with silane molecules), for oxides nanoparticles they are typically hydroxyls, with proper reactive molecules, or by covering the particle with surfactant molecules that can be physically adsorbed on the surface.

A complementary approach to increase the compatibility between inorganic nanoparticles and organic polymers is to cover the nanoparticle surface with a polymer coating. This coating may be made by using difunctional acrylic monomers such as: 2-Hydroxyethyl Acrylate (HEA), 2-Hydroxypropyl Acrylate (HPA), Butanediol Monoacrylate (BDMA), Glycidyl Methacrylate (GMA), diglycidyl ether of bisphenol A (DGEBA), Dimethylaminoethyl Methacrylate, DMAEMA Hydroxyethyl acrylate (HEA), Dimethylaminoethyl Acrylate (DMAEA). In fact amino, glycidyl or hydroxy groups can strongly interact with the surface of the inorganic nanoparticles and the polymerization of the acrylic groups may create a rigid network around the particle.

Inorganic particles may be bought already having a modified surface. Examples of such particles are: Degussa TEGO® SUN Z800 (ZnO), Degussa VP AdNano® Z805 (ZnO), Degussa AEROXIDE® $TiO_2$ T805.

Dispersing the Nanoparticles

The nanoparticles are added to the distilled monomer in order to form a suspension with a concentration of nanoparticles of 1% in weight or more. In order to break up the clusters into the primary particles, the suspension is subject both to sonication and subsequently to centrifugation. The highly concentrated suspension is first sonicated using a 20 kHz sonicator for 15 min. Big clusters of particles are thus broken up and a whitish suspension is obtained. Since it may not be possible to break up all aggregates by means of sonication, centrifugation may be needed in order to remove from the suspension large particles and aggregates having average particle sizes that do not fall within the range of average sizes according to an embodiment.

In fact, a relation exists between the average particle size and the time necessary for particles having such average size to settle on the bottom of a test tube of a certain height. By means of this relation the centrifugation time necessary for all particles having an average size bigger than a certain value to sediment to the bottom of the test tube has been calculated.

Dynamic light scattering (DLS) tests confirmed that the nanoparticles in the centrifuged suspension having average size larger than the chosen limit value are removed, and thus that centrifugation technique is adequate for selecting particle in the ranges according to an embodiment.

Adding the Initiator of Reaction

The initiator activates the polymerization process. In an embodiment the reaction that takes place is called chain growth polymerisation. In this reaction unsaturated monomer molecules add on to a growing polymer chain one at a time. The process may be divided in three main steps:

1. The initiator is used in this first step since it is responsible for starting the polymer chain. The initiator is of the family of thermal free radical initiators, it may belong to the family of organic peroxides such as BPO (Benzoyl peroxide) or to the family of azo compounds like AIBN (Azobisisobutyronitrile). These compounds, when taken to not very high temperatures (below 100° C.) may be broken into two radicals. These radicals then form a stable bond with a carbon atom in the MMA and the reaction starts. This first step is called chain initiation.
2. Propagation of the reaction, long chains are formed due to the free radicals which combine with the monomer molecules.
3. Termination, polymerization comes to and end due to the processes of combination or disproportionation.

The radical initiator used in an embodiment is Benzoyl peroxide (BPO, $C_{14}H_{10}O_4$). This choice is convenient since at 54° C. (this is the temperature at which our reaction takes place) BPO has a half life of 156 h and a decomposition rate of $1.23*10^{-6}$, thus it may be possible to conduct the polymerization reaction of the nanocomposite having a PMMA matrix at a temperature far away from the boiling temperature of MMA and in reasonable amounts of time (about 1 day).

The suspension is poured into a glass mould and the reaction is carried out in a reactor, preheated at a temperature of 54° C., under continuous flux of nitrogen.

After polymerization the nanodiffuser is subject to a process of curing that can last up to 3 days at a temperature of 94° C. in order to remove any residual monomer present inside the nanocomposite and to decompose any remaining BPO.

The surfaces of the nanodiffuser are treated with appropriate lapping tools and abrasive chemicals in order to remove any superficial impurities that may compromise the optical properties of the diffuser.

Method B—Two-Step Polymerization

This method enables to control much better the auto acceleration effect and the problem of shrinkage, thus giving a final product having a much higher quality. This procedure consists of two steps: a pre-polymerization step and a polymerization step. For a detailed description of the industrial process refer to Martin Rivera-Toledo et al. "Dynamic Modeling and Experimental Validation of the MMA Cell-Cast Process for Plastic Sheet Production" Ind. Eng. Chem. Res. 2006, 45, 8539-8553, which is incorporated by reference. In the prepolymerization step experimental conditions are set as modest monomer conversion values (15-20%) are obtained, the so obtained product is a very viscous liquid called a syrup. The syrup is obtained adding a small quantity of initiator to the monomer and by heating the system to a temperature below 100° C. and above 50° C. which depends on the half-life of the initiator. The system is kept at this temperature until the desired degree of conversion is reached. After this step the nanoparticles are added to the system. A radical initiator is responsible for starting the polymerization. A quantity of about 0.2% of a second radical initiator is dissolved in approximately 10% (calculated on the weight of syrup that is available) of pure distilled monomer. This mixture is added to the syrup containing nanoparticles and the system is kept stirring for about 1 hour in order to gain a perfect mixture of the two phases. The dispersion is poured into a mould and polymerization reaction takes place in a water bath at a temperature of approximately 60° C.

Second Technique: Extrusion

To produce nanodiffusers according to an embodiment by extrusion polymerization a two step process has been considered. In a first step PMMA pellets and small quantities of nanoparticles, are mixed together using a double screw extruder to produce new pellets containing the nanoparticles, the so-called masterbatch. Thus the screw is not only used to melt the plastic but also to break the nanoparticles and then to mix them with the melted plastic. The master batch is usually at a very high concentration of nanoparticles, much higher than the 0.01% that is required. In a second step, suitable quantities of masterbatch are mixed with PMMA in order to produce pellets having the desired concentration. These nanocomposite pellets will then be shaped in the desired way through the moulding process.

Third Technique: the Hybrid Method by Casting and Extrusion

Another method that may be used for the production of diffusers according to an embodiment makes use of both cell casting and extrusion techniques. First, by means of the cell casting process (either process A or B as described above) a thick sample containing a large number of particles is prepared. By large number it is meant that the sample operates in large multiple scattering regime, if used as it is. However, the particle concentration (the volume filling fraction) should not exceed the value above which, for the given particle size, the resulting particle position distribution looses its randomness (see section on the optical properties). Notably, the sample should not contain a significant number of particle aggregates, or clusters where the local concentration is larger than the limit imposed by the set maximum filling fraction, since this circumstance may deteriorate the final optical quality of the composite. This nanocomposite is then broken up into small pieces and is fed into the extruder together with a suitable quantity of PMMA pellets in order to lead to the development of a final diffuser whose total number of particles seen by the testing light beam has the desired value (for example, it is below the limit for multiple scattering, if this process has to be hindered in respect to the illuminating direction considered). This method leads to a final diffuser, which appears homogenous at the macroscopic (mm-m) scale, but which is inhomogeneous not only at the nm level, but also at the intermediate, µm-mm scale. It is noted that, as long as the particle position remains not correlated, the diffuser scattering properties are determined by the average particle distribution, being the total number of particle in the beam path what determines the scattering, no matter if these particles are evenly or unevenly distributed in the diffuser. However, from a practical point of view it may be easier to prepare optically thick nanodiffusers free from aggregates (or free from large particles, too dense clusters etc) by means of carefully controlled cell-casting technique, than by simply dispersing the nanoparticles in the extruder. The use of beads of nanocomposite material may be implemented also for industrial cell-casting production of the nanodiffuser, where large volume nano-composite diffusers are developed.

Method: Measurement of the "Monochromatic Normalized Collinear Transmittance, $T(\lambda)$"

The experimental measurement procedure described in what follows is meant to define the "Monochromatic Normalized Collinear Transmittance, $T(\lambda)$" of the diffuser at the selected wavelength and propagation direction. Intuitively, the quantity is the ratio between the transmittance of the diffuser in the propagation direction, which does not account for the contribution of the scattered light, and the transmittance of a reference sample identical to the diffuser except for the fact that it does not contain the transparent nanoparticles. More precisely, considering as testing beam a non polarized quasi-monochromatic and collimated light beam, with central wavelength $\lambda$, spectral bandwidth $\Delta\lambda<10$ nm and angular divergence $\Delta\theta<5$ mrad, which traverses the diffuser in a given propagation direction, and defining as "Monochromatic collinear Transmittance" of a sample at the wavelength $\lambda$ in the selected direction the ratio between (i) the radiant power which propagates beyond the sample in the same direction and within the same $\Delta\theta<5$ mrad divergence solid angle, and (ii) the radiant power of the impinging beam, the proposed measurement procedure provides the ratio between: (i) the Monochromatic Collinear Transmittance of the diffuser and: (ii) Monochromatic Collinear Transmittance of a reference sample identical to the diffuser except for the fact that it does not contain the transparent nanoparticles, said ratio being the quantity here defined as: "Monochromatic Normalized Collinear Transmittance of the diffuser at the given wavelength an for the given propagation direction".

Figure 9:
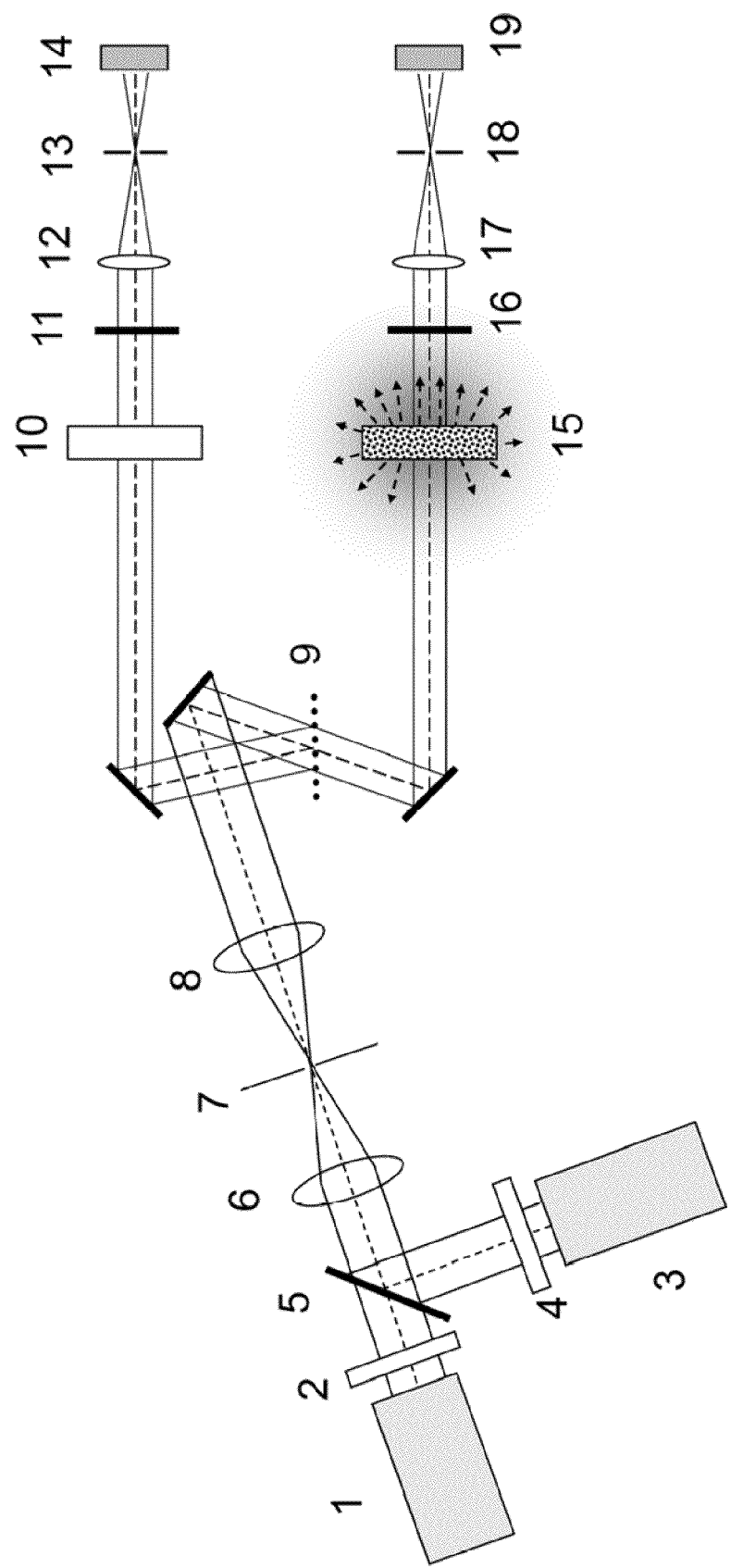
FIG. 9 schematically illustrates the experimental apparatus to be used to measure the "Monochromatic Normalized Collinear Transmittance"
Figure 10:
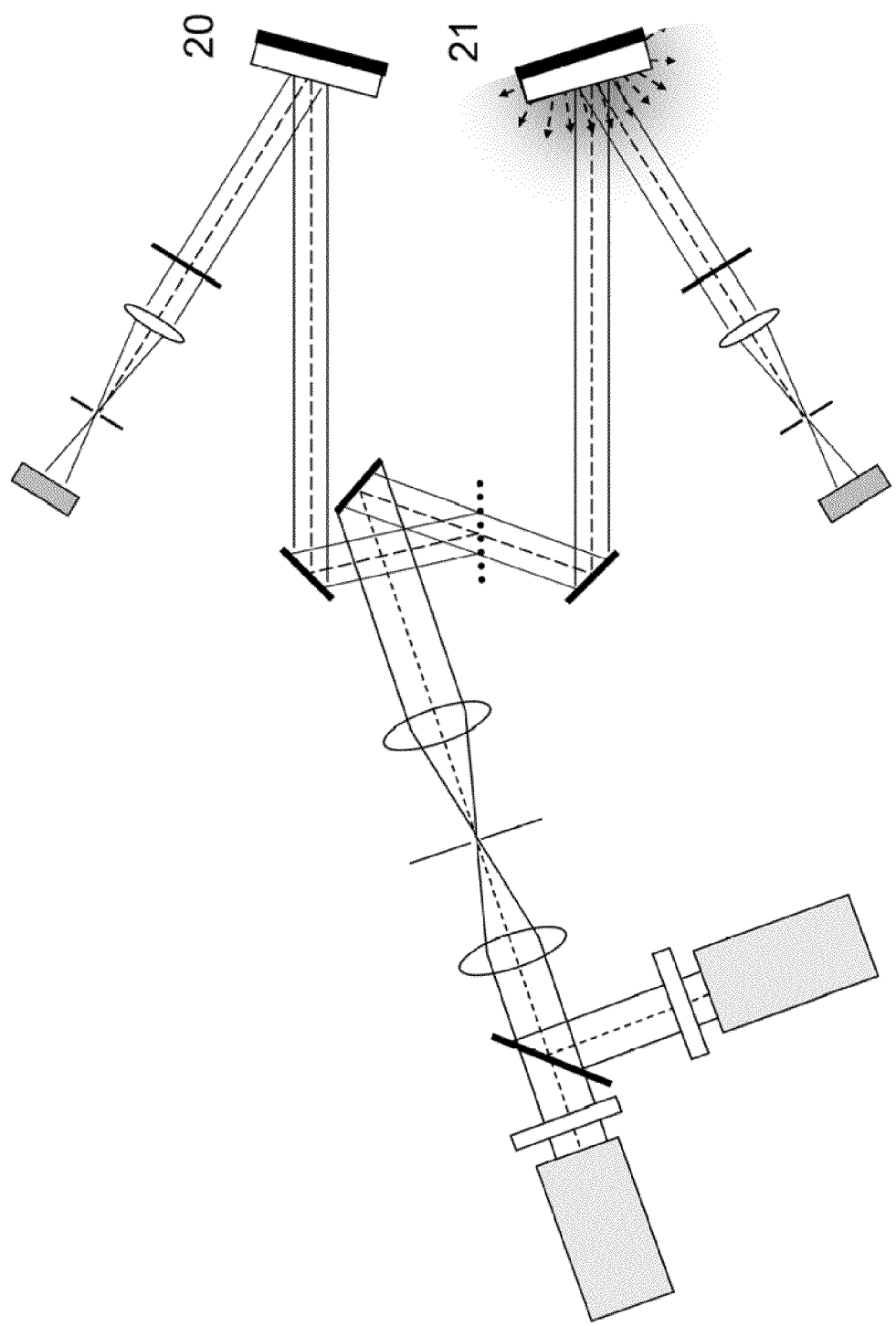
FIG. 10 schematically illustrates the experimental apparatus to be used to measure the "Monochromatic Normalized Collinear Transmittance" in the particular case where the diffuser presents a reflecting surface.

The experimental apparatus, illustrated in FIG. 9 and FIG. 10, comprises:

1. A blue laser source emitting at 450±5 nm
2. A depolarizer and an interferential filter transmitting only a 10 nm wide bandwidth centered at 450 nm
3. A red laser source emitting at 630±5 nm
4. A depolarizer and a 10 nm wide interferential filter transmitting only a 10 nm wide bandwidth centered at 630 nm
5. A cinematic mirror
6. An achromatic focusing lens
7. A pin-hole placed at the focal point of the lens to spatially filter the beam
8. An achromatic collimating lens
9. A broadband 50% beam splitter
10. The reference sample
11. A neutral density filter
12. A focusing achromatic lens
13. A pin-hole placed at the focal point of the lens to spatially filter the beam
14. A detector
15. The diffuser to be characterized
16. A neutral density filter
17. A focusing achromatic lens
18. A pin-hole placed at the focal point to spatially filter the beam
19. A detector
20. The reference sample with reflecting back surface
21. The diffuser to be characterized with reflecting back surface The radiation delivered by either the 450 nm or the 630 nm lasers, which may be independently selected by commuting the position of the cinematic mirror, after having passed through a de-polarizing element and an interferential filter to remove spectral components which might be present out of the 10 nm accepted bandwidth, is sent to a spatial filter, which acts also as beam expander and collimator, which causes beam divergence <5 mrad for both the sources. The beam is then split in two equal arms, which are sent to the samples. In the following it is called channel 1 (top in the figure) the one used for the reference, and channel 2 (bottom) the one used for the nanodiffuser. The transmitted components are focused by achromatic lenses (12, 17) on two pin holes (13, 18), whose size is set to select only the radiation transmitted by the samples within a 5 mrad divergence angle. The choice of such small solid angle ensures that the light scattered by the sample at any angle does not contribute to the signal which is detected after the pin hole. Neutral density filters (11, 16) are used to optimally match the detector dynamic range. If it happens that the sample has a high reflectivity coating on one face, so that the light is not transmitted through the sample, the technique to be used is shown in FIG. 10. The apparatus is identical to the previous one, with the only difference that the beam is transmitted, reflected and then transmitted again through the sample before being sent to the spatial filter and detection.

A problem in ascertaining the contribution to attenuation caused by the scattering is that of isolating it from the other two contributions caused by the reflection at the entrance and exit air-diffuser interfaces, and by the possible absorption caused by the matrix or other spurious components in the sample. This problem is solved by an embodiment of a method here proposed because the diffuser is tested against a reference sample which is virtually identical to the diffuser with the only exception that it does not contain the nanoparticles Procedure For each of the two wavelengths, the procedure is repeated identical, changing only the light source. Each measurement procedure is performed in two steps.

Step 1: System Calibration

This step is aimed at removing any possible contribution due to the asymmetry existing between the two channels. To this end two substantially identical reference samples are positioned in place 10 and 15, where suitable holders exist to ensure maximum reproducibility in sample positioning. If $P_0$ is the power of the used laser, $T_A$ is transmittance that the reference sample would have in the presence of the sole absorption effect and $T_R$ transmittance that the reference sample would have in the presence of the sole reflection, the two detectors will now measure the two signals:

$V_1 = c_1 P_0 T_R T_A$ and $V_2 = c_2 P_0 T_R T_A$, where $c_1$ and $c_2$ are two constants which do not depend on the sample but on the apparatus, and which may be slightly different since they account for all the possible asymmetries in the layout, as for example those due to the unbalanced power in the two arms, the slightly different detector sensitivity, pin-hole dimensions etc. The result of the calibration measurement gives: $c_1/c_2 = V_1/V_2$ Step 2: Measurement In the second step the reference sample in channel 2 is replaced by the nano-diffuser which may be characterized. If now the power the laser is $P'_0$ which might be the same or different from $P_0$, it is defined as Monochromatic Normalized Collinear Transmittance of the sample at the given wavelength the quantity $T \equiv V'_2/(c_2 P'_0 T_R T_A)$. At this stage, the two detectors will give therefore the signals $V'_1 = c_1 P'_0 T_R T_A$ and $V'_2 = c_2 P'_0 T_R T_A T$. By using $c_1/c_2 = V_1/V_2$, it is finally obtained $T = (V'_2 V_1)/(V'_1 V_2)$. By repeating the measurement with both laser sources, T(450 mm) and T(630 mm) are finally obtained.

Note. If the sample is macroscopically inhomogeneous, the procedure implies to take the minimum measured Transmittance if the goal is to determine $T_{min}$, and the maximum measured Transmittance if the goal is to determine $T_{Max}$.

EXAMPLES

Example 1

Production of a Bulk Diffuser of PMMA/TiO$_2$

A sky-sun diffuser was produced by means of an in situ bulk polymerization technique.

In an embodiment Methylmethacrilate (MMA) was used for the matrix and Degussa AEROXIDE TiO$_2$ T805 for the nanoparticles, which have a nominal dimension of 21 nm (as given by the producer). The particles, as received from the producer, are in the form of macro agglomerates with dimensions up to 1 μm. In order to use them the agglomerates were separated into the primary particles. A first step to reach this goal consisted in the sonication of a high concentrated (about 1% in weight) suspension of TiO$_2$ nanoparticles in MMA. The duration of this process depends on the power of the employed instrument and on the volume of the dispersion. In the present example the suspension of TiO$_2$ nanoparticles in MMA was sonicated for 15 minutes. This process alone was not enough to separate all the agglomerates and to obtain a distribution of particles having a mean size of less than 80 nm. A further step was taken. In this second step only those particles having the desired dimension (≦80 nm) were selected and those having bigger sizes were discarded. This was carried out by using a centrifuge that reaches an acceleration of about 3421 g for 14 minutes in order to obtain a suspension containing only TiO$_2$ nanoparticles with sizes of 69.5 nm. The average particle size was measured using Dynamic Light Scattering (DLS) Technique. The suspension containing the nanoparticles having the selected sizes was diluted in order to obtain 30 ml of suspension with a concentration ranging from 100 to 400 ppm in weight of TiO$_2$ nanoparticles. In order to reduce the formation of air bubbles within the polymer during reaction the suspension was subjected to three cycles of freeze and thaw. Since thermal cycles cause the aggregation of particles, the suspension was sonicated once more (5 min) before the next step. To start the polymerization reaction benzoyl peroxide (BPO) was used as the initiator in a quantity of 1 mmol/l. Polymerization was carried out in a reactor under nitrogen atmosphere, using a 150 ml, Ø=54 mm Becker as the mould. The reaction lasted 36 hours at the temperature of 54° C. After polymerization the bulk diffusers were subjected to a curing process at a temperature of 94° C. for 3 days in order to increase the degree of polymerization and to decompose any residual BPO. The bulk diffuser was then treated in order to remove impurities from the surface, which might degrade the optical quality of the diffuser.

The sky-sun nanodiffusers produced using this method had a thickness of 1 cm. In the following table the values of γ and T(450 nm) are shown. Concentration was varied in order to show the impact of an increase in the number of particles on the transmission properties of the sky-sun diffuser. As expected from the results presented in FIG. 5, due to chosen particle size and refraction index mismatch, the scattering behaves very close to the Rayleigh limit for all concentrations, thus confirming that no particle aggregations occurred

| PARTICLE EFFECTIVE SIZE, D [nm] | m | CONCENTRATION (PPM) | γ | $T_{450}$ |
|---|---|---|---|---|
| 98 | 1.9 | 30 | 3.87 | 0.82 |
| 98 | 1.9 | 100 | 3.87 | 0.52 |
| 98 | 1.9 | 300 | 3.86 | 0.14 |

Figure 11:
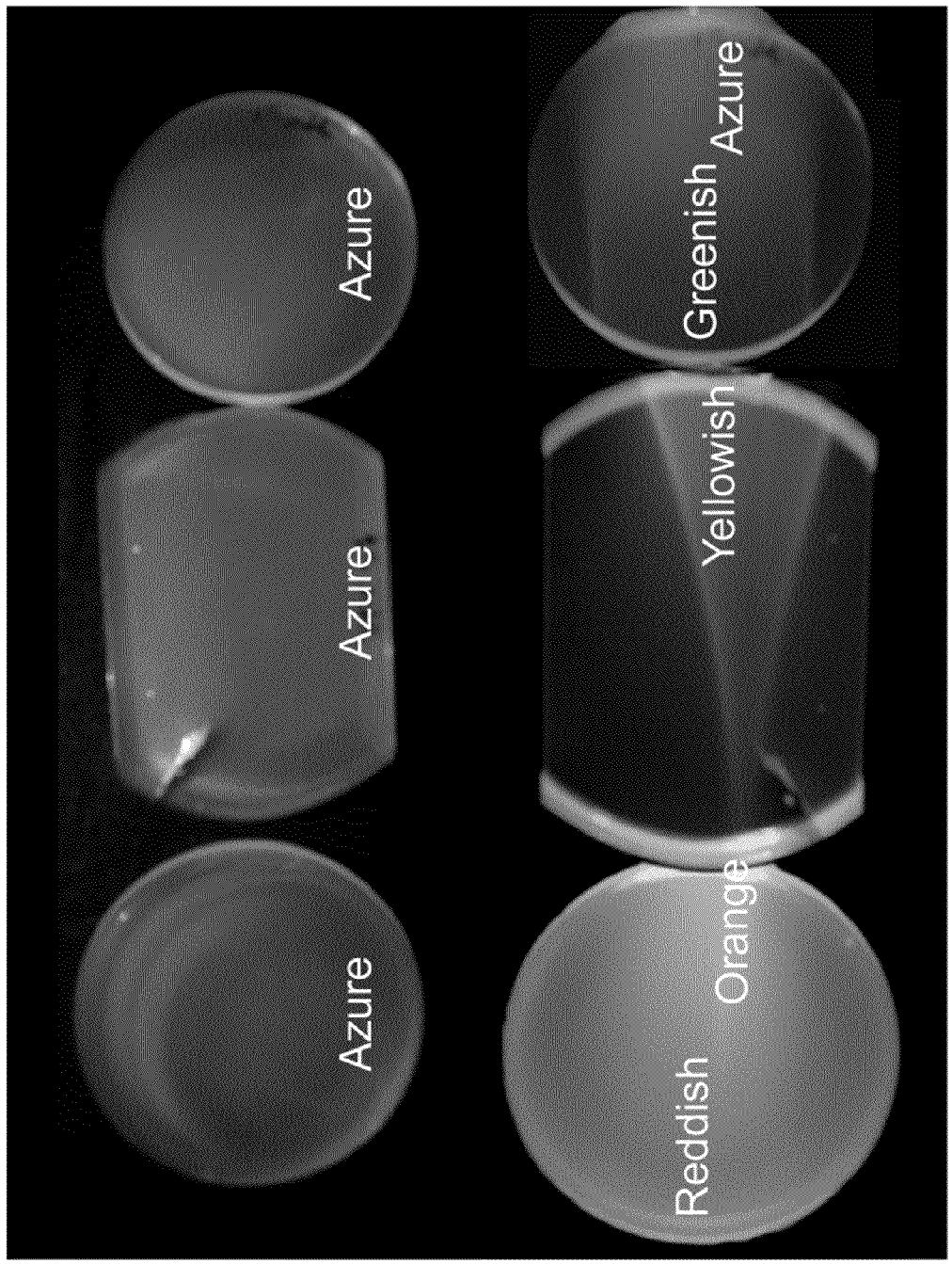
FIG. 11 (top) illustrates the effect of Rayleigh back scattering when three sky-sun nanodiffuser disks are front illuminated by a commercial InGaN white LED, and seen against a dark background, while FIG. 11 (bottom) shows the effect of the light which is scattered by the same disks when the light comes from a side.

For what concerns the diffuser visual appearance, FIG. 11 (top) outlines the effect of Rayleigh back scattering when three sky-sun nanodiffuser disks were front illuminated by a commercial InGaN white LED, and seen against a dark background. The result shows that the color of the back-scattered light is Azure, similar to that of the noon sky. FIG. 11 (bottom) shows a collage (increasing exposure time from right to left) of snapshots obtained when the same disks were illuminated by the same LED from right side, so that light was guided inside the disks due to total internal reflection at the disk surface. Rayleigh scattering now diffuses out of the disks first the Azure, than the Yellow, and finally the Orange and the Red colors.

By using the same procedure as above but for the case of $TiO_2$ particles bought from Sigma Aldrich, which do not have an hydrophobic coating, and without performing the centrifugation process, sky-sun nanodiffusers were not obtained with correct parameters. In fact, DLS measurements on the suspension of nanoparticles and MMA before polymerization showed that the particles in the diffuser had a mean size of 300 nm, which is outside the range of average particle diameter according to an embodiment. After polymerization, the nanodiffuser appeared whitish for all the investigated concentrations.

Production of a Bulk Diffuser of PMMA/ZnO

In this example the same procedure described above was used, with the exception of $TiO_2$ being replaced by hydrophobized ZnO nanoparticles bought from Degussa (TEGO® SUN Z 800). Also, different centrifugation times were used. DLS measurements on the suspension of nanoparticles and MMA before polymerization showed that the particles in the diffuser had a mean size of 160 nm. For a volume concentration of 0.0017% and a nano-diffuser of thickness 7 mm measurement of the Monochromatic Normalized Collinear Transmittance gave T(450 nm)=0.83 and γ=2.8, which falls within the defined acceptable range. The nanodiffuser when illuminated in a backscattering configuration appeared azure.

Some embodiments have been described, but it is evidently susceptible to numerous modifications and variants within the scope of the disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A solid optical diffuser which comprises a transparent solid matrix embedding a dispersion of transparent nanoparticles, wherein:
    said nanoparticles have an average size d in the range 10 nm≦d≦240 nm;
    the ratio between the blue and red scattering optical densities γ≡Log⌊T(450 nm)⌋/Log⌊T(630 nm)⌋ of said solid optical diffuser falls in the range 5≧γ≧2.5, where T(λ) is the monochromatic normalized collinear transmittance of the solid optical diffuser, which is the ratio between the transmittance of the solid optical diffuser, without the contribution of scattered light, and the transmittance of a reference sample identical to the solid optical diffuser except for the fact that it does not contain nanoparticles;
    along at least a first propagation direction, the monochromatic normalized collinear transmittance of the solid optical diffuser is T(450 nm)≧0.4; and
    along at least a second propagation direction, the monochromatic normalized collinear transmittance of the solid optical diffuser is T(450 nm)≦0.9.

2. The solid optical diffuser according to claim 1, wherein the relative refraction index $$m \equiv \frac{n_p}{n_h},$$

where $n_p$ is the refractive index of said nanoparticles and $n_h$ is the refractive index of said transparent solid matrix, falls in the range 0.7≦m≦2.1, and the effective particle diameter, $D \equiv dn_h$, fulfills D[nm]≦132 m+115 if 0.7≦m<1; D[nm]≦240 if 1<m<1.35 and D[nm]≦−135 m+507 if 1.35≦m≦2.1.

3. The solid optical diffuser according to claim 2, wherein, along at least the first propagation direction, the number of nanoparticles per unit area is $$N \le N_{max} = \frac{3.7 \times 10^{-28}}{D^6} \left|\frac{m^2+2}{m^2-1}\right|^2 \text{ [meters}^{-2}\text{],}$$

D being given in meters.

4. The solid optical diffuser according to claim 3, wherein, along at least the second propagation direction, the number of nanoparticles per unit area is $$N \ge N_{min} = \frac{4.24 \times 10^{-29}}{D^6} \left|\frac{m^2+2}{m^2-1}\right|^2 \text{ [meters}^{-2}\text{],}$$

D being given in meters.

5. The solid optical diffuser according to claim 1, wherein the maximum filling fraction is $f \le 10^{-2}$.

6. The solid optical diffuser according to claim 1, moreover being shaped as a parallelepiped panel where the ratio between the largest dimension, L, and the smallest dimension, W, is L/W≧20.

7. The solid optical diffuser according to claim 1, wherein the ratio between the blue and red scattering optical densities γ is comprised in the range 3.5≦γ≦5, and wherein:
    along said first propagation direction, the monochromatic normalized collinear transmittance of the solid optical diffuser is T(450 nm)≧0.6; and
    along said second propagation direction, the monochromatic normalized collinear transmittance of the solid optical diffuser is T(450 nm)≦0.7.

8. The solid optical diffuser according to claim 1, wherein said second propagation direction is the same as said first propagation direction.

9. The solid optical diffuser according to claim 1, wherein said second propagation direction is orthogonal to said first propagation direction, and wherein along said second propagation direction the monochromatic normalized collinear transmittance of the solid optical diffuser is $T(\lambda) \leq 0.5$ for $\lambda \leq 570$ nm.

10. The solid optical diffuser according to claim 9, wherein along said second propagation direction the monochromatic normalized collinear transmittance of the solid optical diffuser is $T(\lambda) \leq 0.1$ for $\lambda \leq 570$ nm.

11. The solid optical diffuser according to claim 9, wherein the relative refraction index $$m \equiv \frac{n_p}{n_h},$$

where $n_p$ is the refractive index of said nanoparticles and $n_h$ is the refractive index of said transparent solid matrix, falls in the range $0.7 \leq m \leq 2.1$, and the effective particle diameter, $D \equiv d n_h$, fulfills $D[nm] \leq 132m+115$ if $0.7 \leq m<1$; $D[nm] \leq 240$ if $1<m<1.35$ and $D[nm] \leq -135\ m+507$ if $1.35 \leq m \leq 2.1$.

12. The solid optical diffuser according to claim 11, wherein, along at least the first propagation direction, the number of nanoparticles per unit area is $$N \leq N_{max} = \frac{3.7 \times 10^{-28}}{D^6} \left| \frac{m^2+2}{m^2-1} \right|^2 \text{ [meters}^{-2}\text{]},$$

D being given in meters.

13. The solid optical diffuser according to claim 12, wherein, along at least the second propagation direction, the number of nanoparticles per unit area is $$N \geq N_{min} = \frac{4.24 \times 10^{-29}}{D^6} \left| \frac{m^2+2}{m^2-1} \right|^2 \text{ [meters}^{-2}\text{]},$$

D being given in meters.

14. The solid optical diffuser according to claim 9, wherein the maximum filling fraction is $f \leq 10^{-3}$.

15. The solid optical diffuser according to claim 9, moreover being shaped as a parallelepiped panel where the ratio between the largest dimension, L, and the smallest dimension, W, is $L/W \geq 10$.

16. The solid optical diffuser according to claim 15, configured to be side-lit by a light source so that the light generated by the light source is partially guided inside the parallelepiped panel by total internal reflection and partially scattered out of the parallelepiped panel because of the action of the nanoparticles dispersed in the panel.

17. An illumination system comprising a solid optical diffuser according to claim 9 and a light source, the solid optical diffuser and the light source being configured so that the light emitted by the light source is at least partially guided inside the solid optical diffuser.

* * * * *

UNITED STATES PATENT AND TRADEMARK OFFICE
CERTIFICATE OF CORRECTION

PATENT NO. : 8,469,550 B2  
APPLICATION NO. : 12/977070  
DATED : June 25, 2013  
INVENTOR(S) : Di Trapani et al.

Page 1 of 1

It is certified that error appears in the above-identified patent and that said Letters Patent is hereby corrected as shown below:

On the title page item (57) in the Abstract at line 14 of the patent, the inequality "T(450 mm) ≥0.4" should read --T(450 nm) ≥0.4--.

In the Claims

In Claim 1 at column 25, line 63, of the patent, the equation "  " should read --γ ≡ Log [T (450 nm)] / Log [T (630 nm)]--.

Signed and Sealed this  
Fifteenth Day of July, 2014

Michelle K. Lee  
*Deputy Director of the United States Patent and Trademark Office*